US012787538B2

(12) United States Patent
Kitano et al.

(10) Patent No.: US 12,787,538 B2
(45) Date of Patent: Nov. 3, 2026

(54) LIGHT-EMITTING ELEMENT, QUANTUM DOT DISPERSION SOLUTION, DISPLAY DEVICE, METHOD FOR MANUFACTURING LIGHT-EMITTING ELEMENT, AND METHOD FOR MANUFACTURING QUANTUM DOT DISPERSION SOLUTION

(71) Applicant: Sharp Display Technology Corporation, Kameyama City (JP)

(72) Inventors: Keisuke Kitano, Kameyama City (JP); Kazuki Goto, Kameyama City (JP); Ryo Kitamura, Kameyama City (JP); Yukio Takenaka, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 301 days.

(21) Appl. No.: 18/722,560

(22) PCT Filed: Feb. 14, 2022

(86) PCT No.: PCT/JP2022/005672
§ 371 (c)(1),
(2) Date: Jun. 20, 2024

(87) PCT Pub. No.: WO2023/152969
PCT Pub. Date: Aug. 17, 2023

(65) Prior Publication Data

US 2025/0048786 A1 Feb. 6, 2025

(51) Int. Cl.

| | |
|---|---|
| ***H10K 50/115*** | (2023.01) |
| ***H10H 20/01*** | (2025.01) |
| ***H10H 20/812*** | (2025.01) |
| ***H10H 20/823*** | (2025.01) |

(Continued)

(52) U.S. Cl.
CPC ......... *H10K 50/115* (2023.02); *H10H 20/011* (2025.01); *H10H 20/012* (2025.01); *H10H 20/812* (2025.01); *H10H 20/823* (2025.01); *H10K 50/15* (2023.02); *H10K 71/15* (2023.02)

(58) Field of Classification Search
None
See application file for complete search history.

(56) References Cited

U.S. PATENT DOCUMENTS

2013/0092885 A1* 4/2013 Cho ........................ B82Y 10/00 977/773
2014/0054541 A1 2/2014 Chung et al.
2015/0076469 A1* 3/2015 Ikemizu ................. C09K 11/06 257/40

FOREIGN PATENT DOCUMENTS

CN 106299159 A 1/2017
JP 2013-089969 A 5/2013

OTHER PUBLICATIONS

Jaehyun Kim et al., "A skin-like two-dimensionally pixelized full-color quantum dot photodetector", Science Advances • Nov. 22, 2019 • vol. 5, Issue 11 • DOI: 10.1126/sciadv.aax8801.

* cited by examiner

*Primary Examiner* — Feifei Yeung Lopez
(74) *Attorney, Agent, or Firm* — ScienBiziP, P.C.

(57) ABSTRACT

A red light-emitting element includes an anode, a cathode, and a red light-emitting layer, the red light-emitting layer includes a compound including Sn (IV) and a chalcogen, a quantum dot, a first compound including Sn (II) and a chalcogen of the same element as the chalcogen, and a chalcogenium ion of the same element as the chalcogen, and a substance amount rate of Sn (II) to Sn (IV) is more than 0% and equal to or less than 50%.

20 Claims, 22 Drawing Sheets

(51) Int. Cl.
*H10K 50/15* (2023.01)
*H10K 71/15* (2023.01)

UV IRRADIATION AND PEEL-OFF

FORMATION OF CARRIER TRANSPORT LAYER

FORMATION OF QD FILM

PEEL-OFF OF QD LAYER

LIGHT-EMITTING ELEMENT, QUANTUM DOT DISPERSION SOLUTION, DISPLAY DEVICE, METHOD FOR MANUFACTURING LIGHT-EMITTING ELEMENT, AND METHOD FOR MANUFACTURING QUANTUM DOT DISPERSION SOLUTION

TECHNICAL FIELD

The disclosure relates to a light-emitting element, a quantum dot dispersion solution, a display device, a method for manufacturing the light-emitting element, and a method for manufacturing the quantum dot dispersion solution.

BACKGROUND ART

PTL 1 and NPL 1 disclose a quantum dot complex in which a quantum dot is protected by an inorganic ligand.

CITATION LIST

Patent Literature

PTL 1: JP 2013-089969 A

Non Patent Literature

NPL 1: Jaehyun Kim, et, al, "A skin-like two-dimensionally pixelized full-color quantum dot photodetector", SCIENCE ADVANCES RESEARCH ARTICLE, MATERIALS SCIENCE, Sci. Adv. 2019; 5:eaax8801 22-11-2019

SUMMARY

Technical Problem

However, in the related art as described above, a PhotoLuminescence Quantum Yield (PLQY) is low. Thus, when a known quantum dot complex is used in a light-emitting element, there is a problem that the light-emitting element is low in light-emitting efficiency.

Solution to Problem

In order to solve the above problem, according to an aspect of the disclosure, there is provided a light-emitting element including a first electrode, a second electrode facing the first electrode, and a light-emitting layer disposed between the first electrode and the second electrode, wherein the light-emitting layer includes a compound including Sn (IV) and a chalcogen, a quantum dot, a first compound including Sn (II) and a chalcogen of the same element as the chalcogen, and a chalcogenium ion of the same element as the chalcogen, and a substance amount rate of the Sn (II) to the Sn (IV) is more than 0% and equal to or less than 50%.

In order to solve the above problem, according to an aspect of the disclosure, there is provided a quantum dot dispersion solution including a compound including Sn (IV) and a chalcogen, a quantum dot, a first compound including Sn (II) and the chalcogen, and a chalcogenium ion including the chalcogen, wherein a substance amount of the Sn (II) included in the quantum dot dispersion solution is more than 0% and equal to or less than 50% of a substance amount of the Sn (IV) included in the quantum dot dispersion solution.

In order to solve the above problem, according to an aspect of the disclosure, there is provided a display device including the light-emitting element according to the aspect of the disclosure.

In order to solve the above problem, according to an aspect of the disclosure, there is provided a method for manufacturing a light-emitting element being a method for manufacturing the light-emitting element according to the aspect of the disclosure, the method including (a) preparing a first solution including a non-polar solvent, an organic ligand being nonionic, and the quantum dot coordinated with the organic ligand, (b) preparing a second solution including a polar solvent, a second compound including the compound, and a third compound not including Sn, the third compound including a chalcogen, the third compound being ionic, the second compound being disassociated into a first cation and the compound, the third compound being disassociated into a second cation and the chalcogenium ion, (c) adding the second solution to the first solution and stirring, and then obtaining a third solution, (d) still-standing the third solution and separating the third solution into a first layer including the non-polar solvent and a second layer including the polar solvent, (e) removing the first layer from the third solution and then obtaining the second layer as a quantum dot dispersion solution, and (f) applying the quantum dot dispersion solution onto the first electrode, volatilizing the polar solvent from the quantum dot dispersion solution, and then obtaining a first light-emitting material layer.

In order to solve the above problem, according to an aspect of the disclosure, there is provided a method for manufacturing a light-emitting element being a method for manufacturing the light-emitting element according to the aspect of the disclosure, the method including (a) preparing a first solution including a non-polar solvent, an organic ligand being nonionic, and the quantum dot coordinated with the organic ligand, (b) preparing a second solution including a polar solvent, a second compound including the compound, and a third compound not including Sn, the third compound including a chalcogen, the third compound being ionic, the second compound being disassociated into a first cation and the compound, the third compound being disassociated into a second cation and the chalcogenium ion, (k) applying the first solution onto the first electrode, volatilizing the non-polar solvent from the first solution, and then obtaining a second light-emitting material layer, and (l) applying the second solution onto the second light-emitting material layer, and then obtaining a third light-emitting material layer.

In order to solve the above problem, according to an aspect of the disclosure, there is provided a method for manufacturing a quantum dot dispersion solution being a method for manufacturing the quantum dot dispersion solution according to the aspect of the disclosure, the method including (a) preparing a first solution including a non-polar solvent, an organic ligand being nonionic, and the quantum dot coordinated with the organic ligand, (b) preparing a second solution including a polar solvent, a second compound including the compound, and a third compound not including Sn, the third compound including a chalcogen, the third compound being ionic, the second compound being disassociated into a first cation and the compound, the third compound being disassociated into a second cation and the chalcogenium ion, (c) adding the second solution to the first solution and stirring, and then obtaining a third solution, (d) still-standing the third solution and separating the third solution into a first layer including the non-polar solvent and a second layer including the polar solvent, and (e) removing the first layer from the third solution and then obtaining the second layer as the quantum dot dispersion solution.

Advantageous Effects of Disclosure

According to an aspect of the disclosure, the PLQY of a quantum dot can be improved.

DESCRIPTION OF EMBODIMENTS

Embodiments of the disclosure will be described below with reference to the accompanying drawings. Hereinafter, for convenience of description, configurations having the same functions as those described in a specific embodiment are denoted by the same reference signs, and descriptions thereof will be omitted.

First Embodiment

Figure 1:
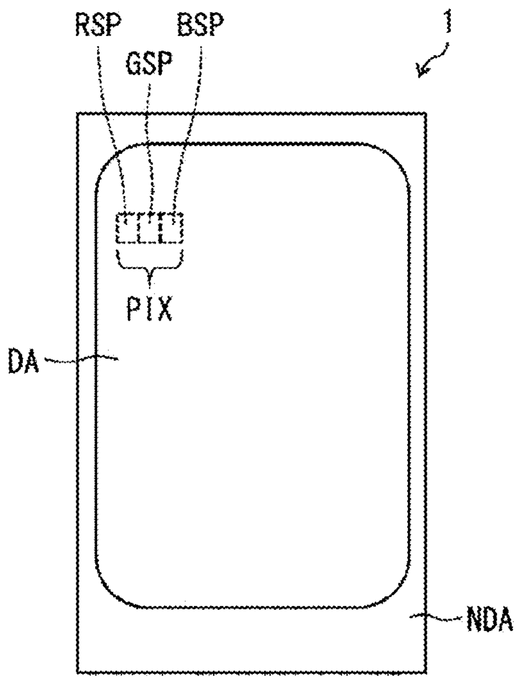
FIG. 1 is a plan view illustrating a schematic configuration of a display device according to a first embodiment.

FIG. 1 is a plan view illustrating a schematic configuration of a display device 1 according to a first embodiment.

As illustrated in FIG. 1, the display device 1 includes a frame region NDA and a display region DA. A plurality of pixels PIX are provided in the display region DA of the display device 1, and each pixel PIX includes a red subpixel RSP, a green subpixel GSP, and a blue subpixel BSP. In the present embodiment, a case will be described as an example in which one pixel PIX includes the red subpixel RSP, the green subpixel GSP, and the blue subpixel BSP, but the disclosure is not limited thereto. For example, one pixel PIX may further include a subpixel of another color in addition to the red subpixel RSP, the green subpixel GSP, and the blue subpixel BSP.

Figure 2:
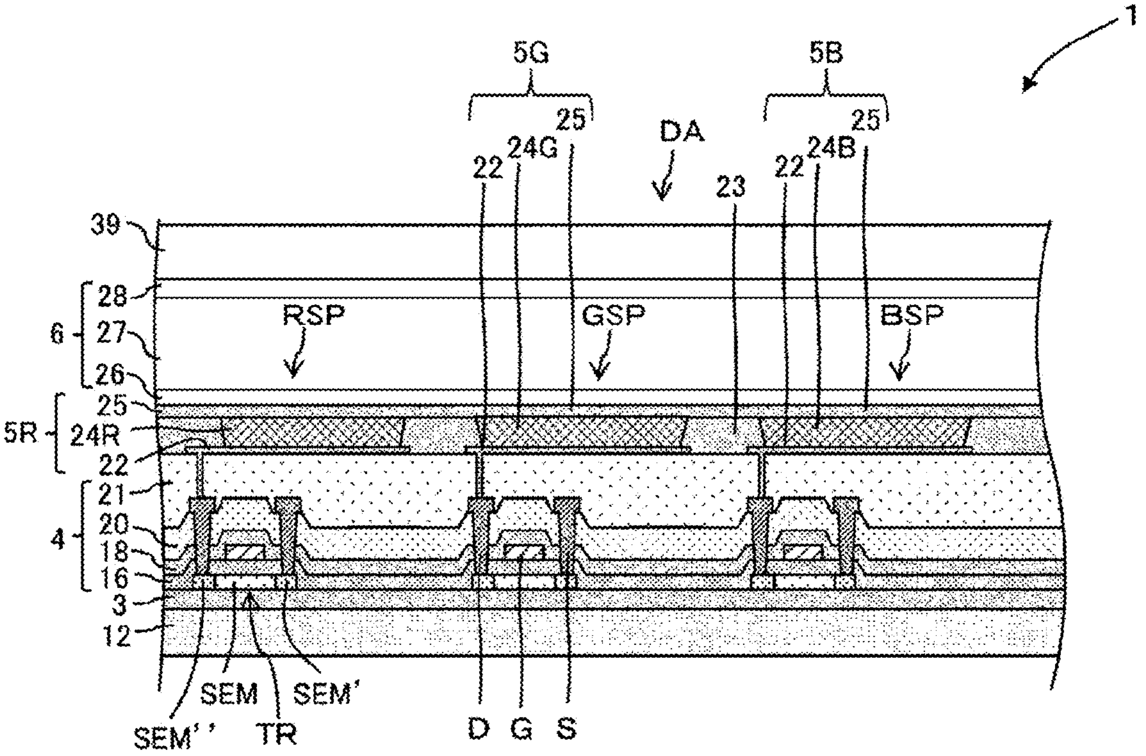
FIG. 2 is a cross-sectional view illustrating a schematic configuration of a display region of the display device according to the first embodiment.

FIG. 2 is a cross-sectional view illustrating a schematic configuration of the display region DA of the display device 1 according to the first embodiment.

As illustrated in FIG. 2, in the display region DA of the display device 1, a barrier layer 3, a thin film transistor layer 4 including transistors TR, a red light-emitting element 5R (light-emitting element), a green light-emitting element 5G (light-emitting element), a blue light-emitting element 5B (light-emitting element), an edge cover 23, a sealing layer 6, and a function film 39 are provided on a substrate 12 in this order from the substrate 12 side.

The red subpixel RSP provided in the display region DA of the display device 1 includes the red light-emitting element 5R (light-emitting element), the green subpixel GSP provided in the display region DA of the display device 1 includes the green light-emitting element 5G (light-emitting element), and the blue subpixel BSP provided in the display region DA of the display device 1 includes the blue light-emitting element 5B (light-emitting element). The red light-emitting element 5R included in the red subpixel RSP includes an anode 22 (first electrode), a function layer 24R including a red light-emitting layer, and a cathode 25 (second electrode), the green light-emitting element 5G included in the green subpixel GSP includes an anode 22 (first electrode), a function layer 24G including a green light-emitting layer, and the cathode 25 (second electrode), and the blue light-emitting element 5B included in the blue subpixel BSP includes an anode 22 (first electrode), a function layer 24B including a blue light-emitting layer, and the cathode 25 (second electrode).

The substrate 12 may be, for example, a resin substrate made of a resin material such as polyimide, or may be a glass substrate. In the present embodiment, the display device 1 is a flexible display device, and thus a case will be described as an example in which the resin substrate made of the resin material such as polyimide is used as the substrate 12, but the disclosure is not limited thereto. In a case where the display device 1 is a non-flexible display device, the glass substrate may be used as the substrate 12.

The barrier layer 3 is a layer that inhibits foreign matters, such as water and oxygen, from entering the transistor TR, the red light-emitting element 5R, the green light-emitting element 5G, and the blue light-emitting element 5B, and can be formed of, for example, a silicon oxide film, a silicon nitride film, or a silicon oxynitride film, or a layered film thereof formed by Chemical Vapor Deposition (CVD).

The transistor TR portion of the thin film transistor layer 4 including the transistor TR includes a semiconductor film SEM, doped semiconductor films SEM' and SEM", an inorganic insulating film 16, a gate electrode G, an inorganic insulating film 18, an inorganic insulating film 20, a source electrode S, a drain electrode D, and a flattening film 21. A portion other than the transistor TR portion of the thin film transistor layer 4 including the transistor TR includes the inorganic insulating film 16, the inorganic insulating film 18, the inorganic insulating film 20, and the flattening film 21.

The semiconductor films SEM, SEM' and SEM" may be formed of Low-Temperature PolySilicon (LTPS) or an oxide semiconductor (for example, an In—Ga—Zn—O based semiconductor), for example. In the example of the present embodiment described herein, the transistor TR has a top gate structure, but the disclosure is not limited thereto, and the transistor TR may have a bottom gate structure.

The gate electrode G, the source electrode S, and the drain electrode D may be formed of a single-layer film or a layered film of a metal including, for example, at least one of aluminum, tungsten, molybdenum, tantalum, chromium, titanium, or copper.

The inorganic insulating film 16, the inorganic insulating film 18, and the inorganic insulating film 20 may be formed of, for example, a silicon oxide film, a silicon nitride film, or a silicon oxynitride film, or a layered film thereof, formed by CVD.

The flattening film 21 may be formed of a coatable organic material such as polyimide or acrylic.

The red light-emitting element 5R includes the anode 22 that is an upper layer overlying the flattening film 21, the function layer 24R including the red light-emitting layer, and the cathode 25. The green light-emitting element 5G includes the anode 22 that is an upper layer overlying the flattening film 21, the function layer 24G including the green light-emitting layer, and the cathode 25. The blue light-emitting element 5B includes the anode 22 that is an upper layer overlying the flattening film 21, the function layer 24B including the blue light-emitting layer, and the cathode 25. Note that the edge cover (bank) 23 with insulating properties covering the edge of the anode 22 is formed, for example, by applying an organic material, such as polyimide or acrylic, and then patterning the organic material by photolithography.

The present embodiment describes that, as an example, each of the red light-emitting element 5R, the green light-emitting element 5G, and the blue light-emitting element 5B is a Quantum dot Light Emitting Diode (QLED).

A control circuit including the transistors TR each of which controls a respective one of the red light-emitting element 5R, the green light-emitting element 5G, and the blue light-emitting element 5B is provided in the thin film transistor layer 4 including the transistors TR corresponding to the red subpixel RSP, the green subpixel GSP, and the blue subpixel BSP. Note that the control circuit including the transistors TR provided corresponding to the red subpixel RSP, the green subpixel GSP, and the blue subpixel BSP and the light-emitting elements are collectively referred to as a subpixel circuit.

The red light-emitting element 5R, the green light-emitting element 5G, and the blue light-emitting element 5B illustrated in FIG. 2 may be a top-emitting type or a bottom-emitting type. Since each of the red light-emitting element 5R, the green light-emitting element 5G, and the blue light-emitting element 5B has a regular layered structure in which the anode 22, the function layer 24R, 24G, or 24B, and the cathode 25 are formed in this order from the substrate 12 side, the cathode 25 is disposed as an upper layer than the anode 22. In the present embodiment, in order to form the top-emitting type, the anode 22 is formed by using an electrode structure (for example, Indium Tin Oxide (ITO)/Ag/Indium Tin Oxide (ITO)) that can reflect visible light, and the cathode 25 is formed by using an electrode material that can transmit visible light.

In the present embodiment, as described above, the red light-emitting element 5R, the green light-emitting element 5G, and the blue light-emitting element 5B are QLEDs, and a quantum dot included in the light-emitting layer of each color includes a ligand made of an inorganic material.

When the quantum dots included in the light-emitting layers of the respective colors include ligands made of an inorganic material, the red light-emitting element 5R, the green light-emitting element 5G, and the blue light-emitting element 5B may have the regular layered structure or an inversely layered structure in which the cathode 25, the function layer 24R, 24G, or 24B, and the anode 22 are formed in this order from the substrate 12 side. In the inversely layered structure, the light-emitting layer of each color is formed on a side closer to the substrate 12 than the hole injection layer, that is, the light-emitting layer of each color is formed before forming the hole injection layer. In the case of such inversely layered structure, since the anode 22 is disposed as an upper layer than the cathode 25, the cathode 25 is formed by an electrode structure (for example, ITO/Ag/ITO) that can reflect visible light, and the anode 22 is formed by an electrode material that transmits visible light in order to obtain the top-emitting type.

Note that the quantum dot included in the light-emitting layer of the light-emitting element according to the disclosure is a dot having a maximum width being equal to or less than 100 nm. The shape of the quantum dot is not particularly limited as long as the maximum width is within the above-described range, and the shape is not limited to a spherical three-dimensional shape (circular cross-sectional shape). The shape of the quantum dot may be, for example, a polygonal cross-sectional shape, a rod-shaped three-dimensional shape, a branch-shaped three-dimensional shape, or a three-dimensional shape having unevenness on the surface, or a combination thereof.

The quantum dot typically includes a semiconductor. The term "semiconductor" as used herein means a material having a certain band gap and capable of emitting light, and examples thereof include at least the following materials. Examples of the semiconductor as used herein include at least one kind selected from the group consisting of group II-VI compounds, group III-V compounds, chalcogenides and perovskite compounds.

Note that a group II-VI compound refers to a compound including a group II element and a group VI element, and a group III-V compound refers to a compound including a group III element and a group V element. Further, the group II element may include a group 2 element and a group 12 element, the group III element may include a group 3 element and a group 13 element, the group V element may include a group 5 element and a group 15 element, and the group VI element may include a group 6 element and a group 16 element. Note that notation of group numbers of elements using Roman numerals is based on the former International Union of Pure and Applied Chemistry (IUPAC) system or the former Chemical Abstracts Service (CAS) system, and notation of group numbers of elements using Arabic numerals is based on the current IUPAC system. Further, examples of the group II-VI compounds include at least one kind selected from the group consisting of MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. Furthermore, examples of the group III-V compounds include at least one kind selected from the group consisting of GaAs, GaP, InN, InAs, InP, and InSb. In addition, a chalcogenide is a compound including a group VIA (16) element, and examples thereof include CdS or CdSe. The chalcogenide may include a mixed crystal of these materials. Additionally, a perovskite compound has, for example, a composition represented by the general formula CsPbX3. A constitutional element X includes, for example, at least one kind selected from the group consisting of Cl, Br, and I.

The electrode material that reflects visible light is not particularly limited as long as the material can reflect visible light and has electrical conductivity. Examples include metal materials such as Al, Mg, Li, and Ag, alloys of the metal materials, a layered body of the metal materials and transparent metal oxides (for example, indium tin oxide, indium zinc oxide, indium gallium zinc oxide, and the like), or a layered body of the alloys and the transparent metal oxides.

On the other hand, the electrode material that transmits visible light is not particularly limited as long as the material can transmit visible light and has electrical conductivity. Examples include a thin film formed of a transparent metal oxide (for example, indium tin oxide, indium zinc oxide, indium gallium zinc oxide, and the like) or a metal material such as Al and Ag, or a nano wire formed of a metal material such as Al and Ag.

A typical electrode forming method can be used as the method of film-forming the anode 22 and the cathode 25, and examples thereof include Physical Vapor Deposition (PVD) such as vacuum vapor deposition, sputtering, Electron Beam (EB) vapor deposition, and ion plating, or Chemical Vapor Deposition (CVD). Further, the method of patterning the anode 22 and the cathode 25 is not particularly limited as long as the method is capable of precisely forming a desired pattern, and specific examples include a photolithography method and an ink-jet method.

The sealing layer 6 is a transparent film and, for example, may be formed of an inorganic sealing film 26 covering the cathode 25, an organic film 27 serving as an upper layer overlying the inorganic sealing film 26, and an inorganic sealing film 28 serving as an upper layer overlying the organic film 27. The sealing layer 6 inhibits foreign matters such as water and oxygen from penetrating into the red light-emitting element 5R, the green light-emitting element 5G, and the blue light-emitting element 5B.

Each of the inorganic sealing film 26 and the inorganic sealing film 28 is an inorganic film and may be formed of, for example, a silicon oxide film, a silicon nitride film, a silicon oxynitride film, or a layered film thereof, formed by CVD. The organic film 27 is a transparent organic film having a flattening effect, and may be formed of a coatable organic material such as acrylic, for example. The organic film 27 may be formed by an ink-jet method, for example.

The case has been described as an example of the present embodiment in which the sealing layer 6 is formed of two layers of an inorganic film and one layer of an organic film provided between the two layers of the inorganic film. However, the layering order of the two layers of the inorganic film and the one layer of the organic film is not limited thereto. Further, the sealing layer 6 may be formed of only an inorganic film, may be formed of only an organic film, may be formed of one layer of an inorganic film and two layers of an organic film, or may be formed of two or more layers of an inorganic film and two or more layers of an organic film.

The function film 39 is a film with at least one of an optical compensation function, a touch sensor function, or a protection function, for example.

Figure 3:
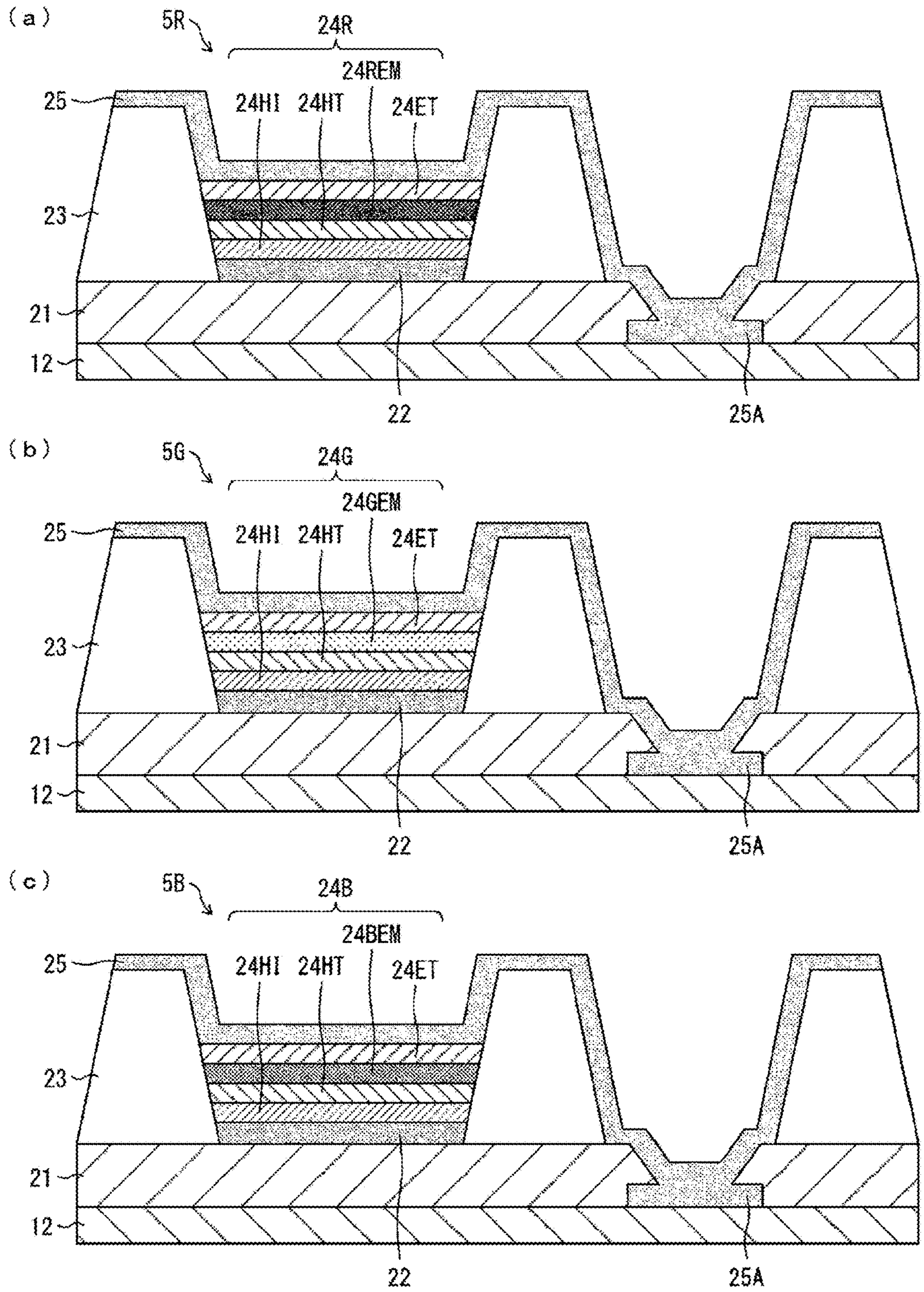
FIG. 3(*a*) is a cross-sectional view illustrating a schematic configuration of a red light-emitting element provided in the display device according to the first embodiment, FIG. 3(*b*) is a cross-sectional view illustrating a schematic configuration of a green light-emitting element provided in the display device according to the first embodiment, and FIG. 3(*c*) is a cross-sectional view illustrating a schematic configuration of a blue light-emitting element provided in the display device according to the first embodiment.

(a) of FIG. 3 is a cross-sectional view illustrating a schematic configuration of the red light-emitting element 5R included in the display device 1, (b) of FIG. 3 is a cross-sectional view illustrating a schematic configuration of the green light-emitting element 5G included in the display device 1, and (c) of FIG. 3 is a cross-sectional view illustrating a schematic configuration of the blue light-emitting element 5B included in the display device 1.

The red light-emitting element 5R illustrated in (a) of FIG. 3 is formed by layering the anode 22, the function layer 24R including a red light-emitting layer 24REM, and the cathode 25 in this order from the substrate 12 (illustrated in FIG. 2) side. In the present embodiment, a case will be described as an example where the function layer 24R including the red light-emitting layer 24REM is formed by layering a hole injection layer 24HI, a hole transport layer 24HT, the red light-emitting layer 24REM, and an electron transport layer 24ET in this order from the anode 22 side, but the disclosure is not limited thereto. Note that when the hole injection layer 24HI is formed of nickel oxide, examples of the hole transport layer 24HT include polyvinyl carbazole (PVK) or poly[(9,9-dioctylfluorenyl-2,7-diyl)-co-(4,4'-(N-(4-sec-butylphenyl))diphenylamine)](TFB). In the present embodiment, an example will be described where TFB is used as the hole transport layer 24HT. In addition, as long as the function layer 24R including the red light-emitting layer 24REM includes a layer made of nickel oxide between the anode 22 and the red light-emitting layer 24REM, for example, only the hole injection layer 24HI made of nickel oxide may be provided between the anode 22 and the red light-emitting layer 24REM, only the hole transport layer made of nickel oxide may be provided between the anode 22 and the red light-emitting layer 24REM, a hole injection layer made of a material different from nickel oxide and the hole transport layer made of nickel oxide may be provided between the anode 22 and the red light-emitting layer 24REM, or a hole injection layer/hole transport layer made of nickel oxide and having both functions of a hole injection layer and a hole transport layer may be provided between the anode 22 and the red light-emitting layer 24REM. Further, the function layer 24R including the red light-emitting layer 24REM may include an electron injection layer instead of the electron transport layer 24ET. Furthermore, an electron injection layer may be provided between the electron transport layer 24ET of the function layer 24R including the red light-emitting layer 24REM and the cathode 25.

The green light-emitting element 5G illustrated in (b) of FIG. 3 is formed by layering the anode 22, the function layer 24G including the green light-emitting layer 24GEM, and the cathode 25 in this order from the substrate 12 (illustrated in FIG. 2) side. In the present embodiment, a case will be described as an example in which the function layer 24G including the green light-emitting layer 24GEM is formed by layering the hole injection layer 24HI, the hole transport layer 24HT, the green light-emitting layer 24GEM, and the electron transport layer 24ET in this order from the anode 22 side, but the disclosure is not limited thereto. Note that when the hole injection layer 24HI is formed of nickel oxide, examples of the hole transport layer 24HT include polyvinyl carbazole (PVK) or poly[(9,9-dioctylfluorenyl-2,7-diyl)-co-(4,4'-(N-(4-sec-butylphenyl))diphenylamine)](TFB). In the present embodiment, an example will be described where TFB is used as the hole transport layer 24HT. Additionally, as long as the function layer 24G including the green light-emitting layer 24GEM includes a layer made of nickel oxide between the anode 22 and the green light-emitting layer 24GEM, for example, only the hole injection layer 24HI made of nickel oxide may be provided between the anode 22 and the green light-emitting layer 24GEM, only the hole transport layer made of nickel oxide may be provided between the anode 22 and the green light-emitting layer 24GEM, the hole injection layer made of a material different from nickel oxide and the hole transport layer made of nickel oxide may be provided between the anode 22 and the green light-emitting layer 24GEM, or a hole injection layer/hole transport layer made of nickel oxide and having both functions of a hole injection layer and a hole transport layer may be provided between the anode 22 and the green light-emitting layer 24GEM. In addition, the function layer 24G including the green light-emitting layer 24GEM may include an electron injection layer instead of the electron transport layer 24ET. Further, an electron injection layer may be provided between the electron transport layer 24ET of the function layer 24G including the green light-emitting layer 24GEM and the cathode 25.

The blue light-emitting element 5B illustrated in (c) of FIG. 3 is formed by layering the anode 22, the function layer 24B including the blue light-emitting layer 24BEM, and the cathode 25 in this order from the substrate 12 (illustrated in FIG. 2) side.

In the present embodiment, a case will be described as an example in which the function layer 24B including the blue light-emitting layer 24BEM is formed by layering the hole injection layer 24HI, the hole transport layer 24HT, the blue light-emitting layer 24BEM, and the electron transport layer 24ET in this order from the anode 22 side, but the disclosure is not limited thereto. Note that when the hole injection layer 24HI is formed of nickel oxide, examples of the hole transport layer 24HT include polyvinyl carbazole (PVK) or poly[(9,9-dioctylfluorenyl-2,7-diyl)-co-(4,4'-(N-(4-sec-butylphenyl))diphenylamine)](TFB). In the present embodiment, an example will be described where TFB is used as the hole transport layer 24HT. Additionally, as long as the function layer 24B including the blue light-emitting layer 24BEM includes a layer made of nickel oxide between the anode 22 and the blue light-emitting layer 24BEM, for example, only the hole injection layer 24HI made of nickel oxide may be provided between the anode 22 and the blue light-emitting layer 24BEM, only the hole transport layer made of nickel oxide may be provided between the anode 22 and the blue light-emitting layer 24BEM, a hole injection layer made of a material different from nickel oxide and the hole transport layer made of nickel oxide may be provided between the anode 22 and the blue light-emitting layer 24BEM, or a hole injection layer/hole transport layer made of nickel oxide and having both functions of a hole injection layer and a hole transport layer may be provided between the anode 22 and the blue light-emitting layer 24BEM. Further, the function layer 24B including the blue light-emitting layer 24BEM may include an electron injection layer instead of the electron transport layer 24ET. Further, an electron injection layer may be provided between the electron transport layer 24ET of the function layer 24B including the blue light-emitting layer 24BEM and the cathode 25.

Figure 4:
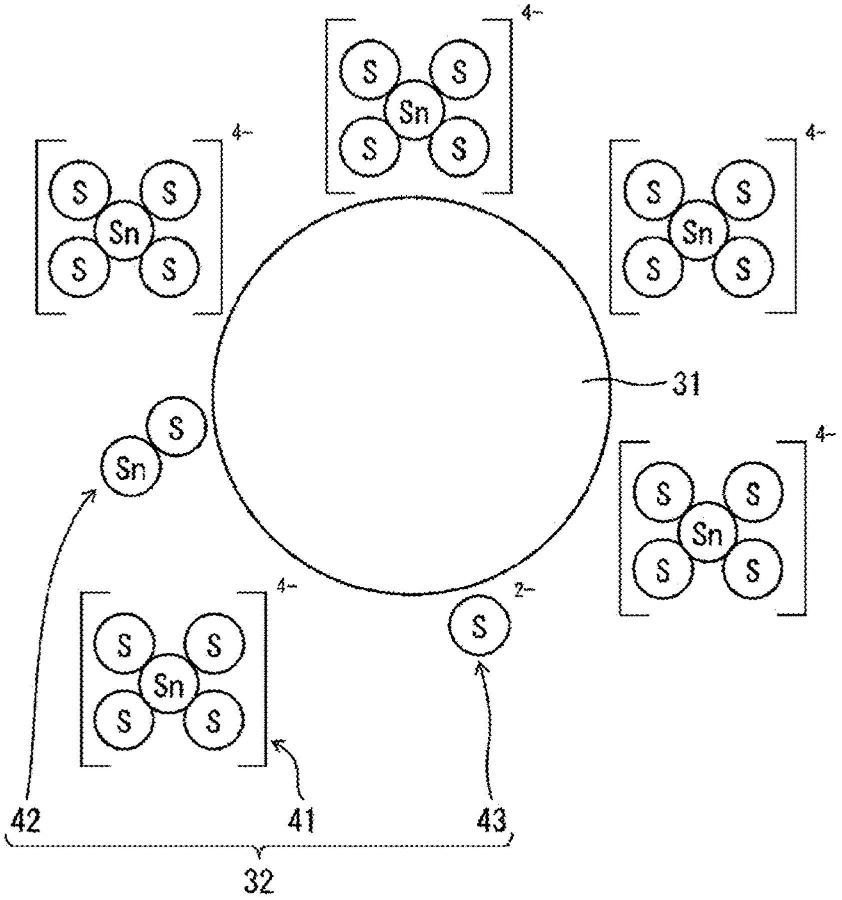
FIG. 4 is a schematic view for describing a light-emitting layer formed in each light-emitting element provided in the display device according to the first embodiment.

FIG. 4 is a schematic view for describing the light-emitting layers 24REM, 24GEM, and 24BEM formed in the light-emitting elements 5R, 5G, and 5B, respectively.

Each of the light-emitting layers 24REM, 24GEM, and 24BEM includes a quantum dot 31 and an inorganic ligand 32 coordinated to the quantum dot 31.

The inorganic ligand 32 includes a tetravalent tin-chalcogen compound 41 (compound) including Sn (IV) and a chalcogen, a divalent tin-chalcogen compound 42 (first compound) including Sn (II) and a chalcogen of the same element as the chalcogen, and a chalcogenium ion 43 of the same element as the chalcogen.

The tetravalent tin-chalcogen compound 41 is, for example, $Sn_2S_6^{4-}$. The divalent tin-chalcogen compound 42 is, for example, SnS. The chalcogenium ion 43 is, for example, $S^{2-}$.

A substance amount rate of Sn (II) to Sn (IV) is more than 0% and equal to or less than 50%.

The substance amount rate of Sn (II) to Sn (IV) is preferably more than 0% and equal to or less than 5.3%. The substance amount rate is more preferably more than 0% and equal to or less than 0.1%.

The compound including Sn (IV) and a chalcogen may be a polyatomic ion including Sn (IV) and a chalcogen.

When the quantum dot 31 and the inorganic ligand 32 are present together in each of the light-emitting layers 24REM, 24GEM, and 24BEM, the inorganic ligand 32 can be regarded as being coordinated to the quantum dot 31.

The polyatomic ion may be reversibly disassociated into the first compound and the chalcogenium ion.

In the present specification, the term "chalcogen" is a generic term for group 16 elements, includes O, S, Se, Te, and Po, and includes not only a chalcogen included in a simple substance but also chalcogens included in a chalcogenium ion, a compound, and a polyatomic ion.

The term "chalcogenide" is a chalcogen compound and is also referred to as chalcogenide.

The term "chalcogenium ion" is a divalent monatomic anion of a chalcogen, and includes, for example, $S^{2-}$, $Se^{2-}$, and the like.

Sn (II) means that a valence of tin in a compound including tin is two.

Sn (IV) means that a valence of tin in a compound including tin is four.

Sn (II) and Sn (IV) can be identified based on X-ray Photoelectron Spectroscopy (XPS) of compounds including Sn (II) and Sn (IV). The substance amount rate between the compound of Sn (II) and the compound of Sn (IV) means a rate of detection intensities obtained by XPS.

The term "substance amount rate" means a rate of substance amounts, and is also referred to as an atomic number rate. The term "substance amount rate" can be established based on elemental analysis (EDX, MS, or the like).

When a known technique is used in which substitution by $Sn_2S_6^{4-}$ is performed, a PhotoLuminescence Quantum Yield (PLQY) is low. Thus, when a known quantum dot complex is used in a light-emitting element, there is a problem that the light-emitting element is low in light-emitting efficiency.

As a result of intensive studies, the present inventors have found that some of Sn included in the inorganic ligand ($Sn_2S_6^{4-}$) is changed from Sn (IV) to Sn (II) by an equilibrium reaction, and as a result, the existing Sn (II) causes extinction of the quantum dot, which lowers the PLQY.

According to the configuration of the quantum dot 31 and the inorganic ligand 32 of the disclosure, the substance amount rate of Sn (II) to Sn (IV) is equal to or less than 50%. Thus, since the influence of extinction of the quantum dot by Sn (II) is less, the PLQY of the quantum dot can be improved as compared with the related art, which makes it possible to improve light-emitting efficiency of the light-emitting element to a practical level or more.

The quantum dot 31 may include a core and a shell formed on a surface of the core. Note that the shell may be detected on an outer side of the quantum dot by analysis of one cross section, and does not necessarily need to be analyzed to cover the entire surface of the core. In the present embodiment, the shell includes $Sn_2S_6^{4-}$ (a compound of Sn and a chalcogen).

A composition ratio of Sn to S (chalcogen) is 10:21, or the composition ratio has a higher chalcogen composition than the chalcogen composition in the above-described composition ratio. The composition ratio is preferably 10:31, or the composition ratio preferably has a higher chalcogen composition than the chalcogen composition in the above-described composition ratio. The composition ratio can be specified based on Energy Dispersive X-ray Spectroscopy (EDX).

The chalcogen is preferably S, Se or Te. Among S, Se, and Te, S, which is the most inexpensive element, is desirable.

A substance amount of the chalcogen included in each of the light-emitting layers 24REM, 24GEM, and 24BEM is preferably equal to or more than 410% of the total substance amount of Sn (IV) and Sn (II) included in a respective one of the light-emitting layers 24REM, 24GEM, and 24BEM. The "substance amount of the chalcogen" means a total substance amount of a chalcogen of the polyatomic ion, a chalcogen of the first compound, and a chalcogen of the chalcogenium ion.

The substance amount of the chalcogen included in each of the light-emitting layers 24REM, 24GEM, and 24BEM is preferably equal to or more than 630% of the total substance amount of Sn (IV) and Sn (II) included in a respective one of the light-emitting layers 24REM, 24GEM, and 24BEM. The chalcogen is, for example, S or Se.

The chalcogenide compound including Sn is usually $Sn_2X_6^{4-}$, $SnX_4^{4-}$, or SnX when the chalcogen is represented by X. Since a chalcogen tends to be a divalent anion ($X^{2-}$), Sn in $Sn_2X_6^{4-}$ or $SnX_4^{4-}$ is Sn (IV) and Sn in SnX is Sn (II). Additionally, equilibrium reactions occurring in the solution are as follows.

[Expression 1]

$$Sn_2X_6^{4-} \rightleftharpoons 2SnX + 4X^{2-}$$

$$SnX_4^{4-} \rightleftharpoons SnX + 3X^{2-}$$

Thus, the more X is in excess relative to Sn, the more $Sn_2X_6^{4-}$ or $SnX_4^{4-}$ relative to SnX is. That is, the substance amount rate of Sn (II) to Sn (IV) is less.

An experiment was conducted on a solution including a polar solvent, quantum dots, $(NH_4)_4Sn_2S_6$, and $Na_2S$. In this experiment, when the substance amount rate of S to Sn in the solution was equal to or more than 630%, a quantum yield of the quantum dot was equal to or more than 80%. This is because the substance amount of Sn (II) to Sn (IV) in the solution is equal to or less than 50%.

In view of the above experimental results, when $Sn_2S_6^{4-}$ or $SnS_4^{4-}$ is used in the light-emitting layer, in a case where S is excessive relative to Sn, in other words, in a case where the substance amount rate of S to Sn is equal to or more than 410%, the quantum dot having a high quantum yield is expected to be obtained.

Thus, the more S relative to Sn is, the greater the substance amount of Sn (II) relative to Sn (IV) is. Thus, the condition that the substance amount rate of S to Sn is equal to or more than 410% is derived.

Accordingly, in the light-emitting layer, the substance amount rate of S to Sn is preferably equal to or more than 410%, and more preferably equal to or more than 630%.

Note that the substance amount rate obtained in the experiment was calculated from a result of Energy Dispersive X-ray Spectroscopy (EDX) analysis.

Each of the light-emitting layers 24REM, 24GEM, and 24BEM is formed of a quantum dot dispersion solution obtained from a third solution obtained by adding and mixing a second solution to a first solution as will be described below.

The first solution includes a non-polar solvent, an organic ligand capable of dispersing a quantum dot in the non-polar solvent, and the quantum dot coordinated with the organic ligand. The second solution includes a polar solvent, a second compound including a compound including Sn (IV) and a chalcogen, and a third compound not including Sn and including a chalcogen.

The second compound is disassociated into a first cation and the compound described above, and the third compound is disassociated into a second cation and a chalcogenium ion.

The quantum dot dispersion solution includes the polar solvent, the compound, the first compound, the compound, the quantum dot, and the chalcogenium ion.

As mentioned above, the more the chalcogen is in excess relative to Sn, the less the substance amount rate of Sn (II) to Sn (IV) is.

According to this configuration, the second solution includes the second compound and the third compound. The third compound is ionic and provides a chalcogenium ion in a solution. This results in excess of the chalcogen relative to Sn in the second solution compared to a solution including only the second compound. Thus, in the equilibrium reaction in which the polyatomic ion included in the second compound is reversibly disassociated into the first compound and the chalcogenium ion, the disassociation of the polyatomic ion is reduced and the amount of the first compounds is reduced. Thus, the amount of Sn (II) causing extinction of the quantum dot is reduced. As a result, the PLQY of the quantum dot can be improved.

The first cation is preferably volatile. The expression "a cation is volatile" means that the cation volatilizes when a salt or solution including the cation is heated. For example, when a salt or a solution including ammonium ions is heated, the ammonium ions become ammonia and volatilize. Thus, ammonium ions are volatile. Since the first cation is volatile, the first cation hardly remains in the light-emitting element. For this reason, the first cation does not affect the performance of the light-emitting element.

The second cation is preferably volatile. Since the second cation is volatile, the second cation hardly remains in the light-emitting element. For this reason, the second cation does not affect the performance of the light-emitting element.

The second cation is an alkali metal ion and is included in the quantum dot dispersion solution. The alkali metal ion preferably includes at least one of Li, Na, or K. The reason why an alkali metal is selected is that a sulfide is expected to be easily soluble in a polar solvent.

Preferably, the polar solvent includes ethanolamine. In the polar solvent including ethanolamine, the quantum dots protected with the organic ligands are easily dispersed as compared with a polar solvent not including ethanolamine.

The quantum dot dispersion solution preferably includes some of the organic ligands. Compared to inorganic ligands, organic ligands vary in length, and some of the organic ligands have longer lengths than those of inorganic ligands. Thus, the organic ligands can extend distances between the quantum dots. By extending the distances between the quantum dots, it is possible to suppress the movement of excitons between the quantum dots and adjust the electrical conductivity of the light-emitting layer.

Figure 5:
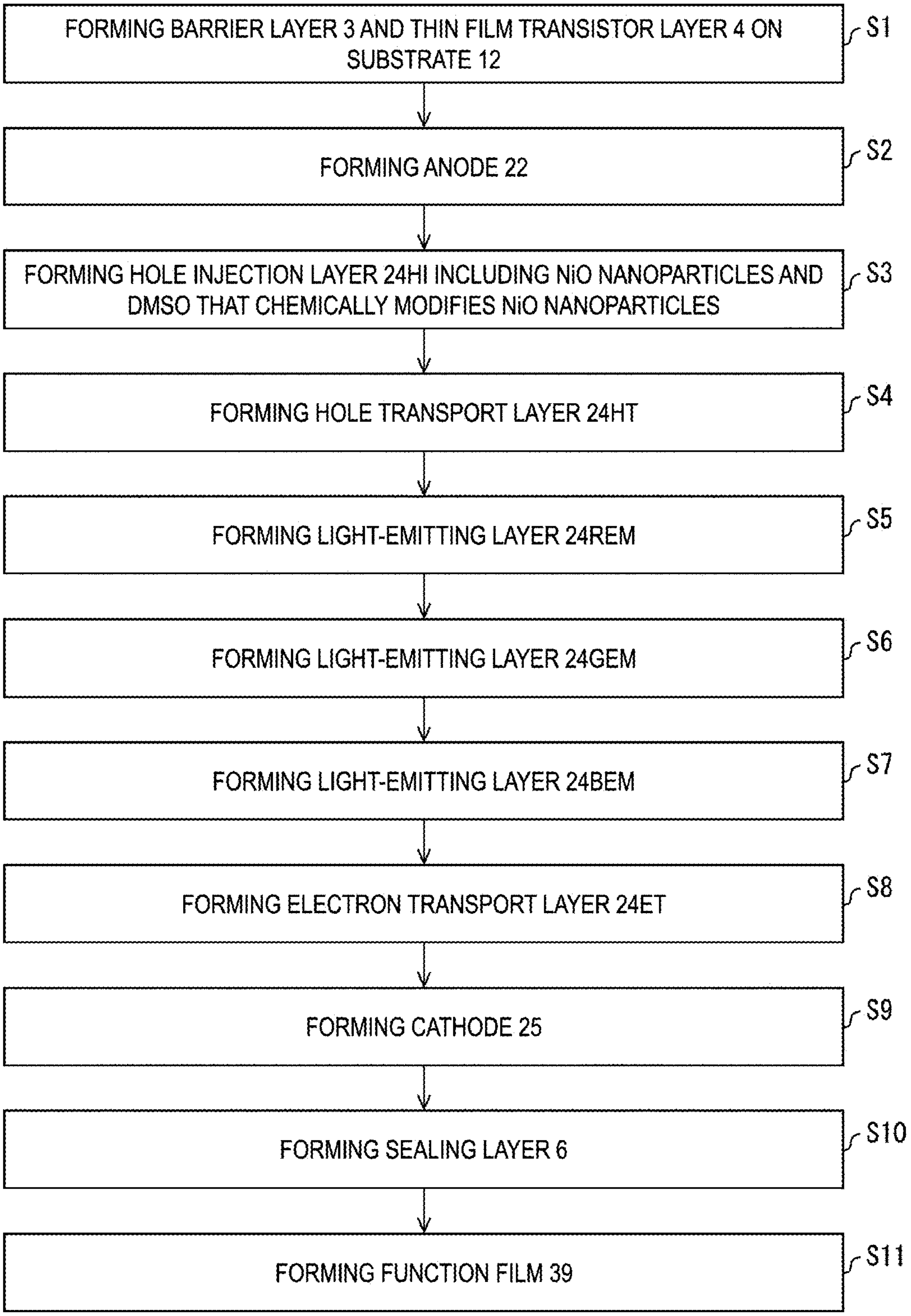
FIG. 5 is a flowchart illustrating a process for manufacturing the display device according to the first embodiment.

FIG. 5 is a flowchart illustrating a process for manufacturing the display device 1.

As illustrated in FIG. 5, the process for manufacturing the display device 1 includes a step (S1) of forming the barrier layer 3 and the thin film transistor layer 4 on the substrate 12, a step (S2) of forming the anode 22, a step (S3) of forming the hole injection layer 24HI including nickel oxide, a step (S4) of forming the hole transport layer 24HT, a step (S5) of forming the red light-emitting layer 24REM, a step ($S_6$) of forming the green light-emitting layer 24GEM, a step (S7) of forming the blue light-emitting layer 24BEM, a step (S8) of forming the electron transport layer 24ET, a step (S9) of forming the cathode 25, a step (S10) of forming the sealing layer 6, and a step (S11) of forming the function film 39. The steps from the step (S2) of forming the anode 22 to the step (S9) of forming the cathode 25 are steps of forming the light-emitting elements 5R, 5G, and 5B on the thin film transistor layer 4. The step of forming the light-emitting elements 5R, 5G, and 5B includes a step of forming a layer including nickel oxide between the anode 22 and each of the light-emitting layers 24REM, 24GEM, and 24BEM of the respective colors, like the step (S3) of forming the hole injection layer 24HI including nickel oxide.

Although not illustrated, in the present embodiment, a step of forming the edge cover 23 having insulating properties and covering the edge of the anode 22 is included between the step (S2) of forming the anode 22 and the step (S3) of forming the hole injection layer 24HI including nickel oxide, but the disclosure is not limited thereto.

Additionally, as illustrated in FIG. 5, in the present embodiment, the step (S5) of forming the red light-emitting layer 24REM, the step ($S_6$) of forming the green light-emitting layer 24GEM, and the step (S7) of forming the blue light-emitting layer 24BEM are performed in this order. In the step (S5) of forming the red light-emitting layer 24REM, as illustrated in (a) of FIG. 3, the red light-emitting layer 24REM included in the red light-emitting element 5R is formed in a predetermined shape. In the step ($S_6$) of forming the green light-emitting layer 24GEM, as illustrated in (b) of FIG. 3, the green light-emitting layer 24GEM included in the green light-emitting element 5G is formed in a predetermined shape. In the step (S7) of forming the blue light-emitting layer 24BEM, as illustrated in (c) of FIG. 3, the blue light-emitting layer 24BEM included in the blue light-emitting element 5B is formed in a predetermined shape. Note that the order of performing the step (S5) of forming the red light-emitting layer 24REM, the step ($S_6$) of forming the green light-emitting layer 24GEM, and the step (S7) of forming the blue light-emitting layer 24BEM is not particularly limited.

Example

Figure 6:
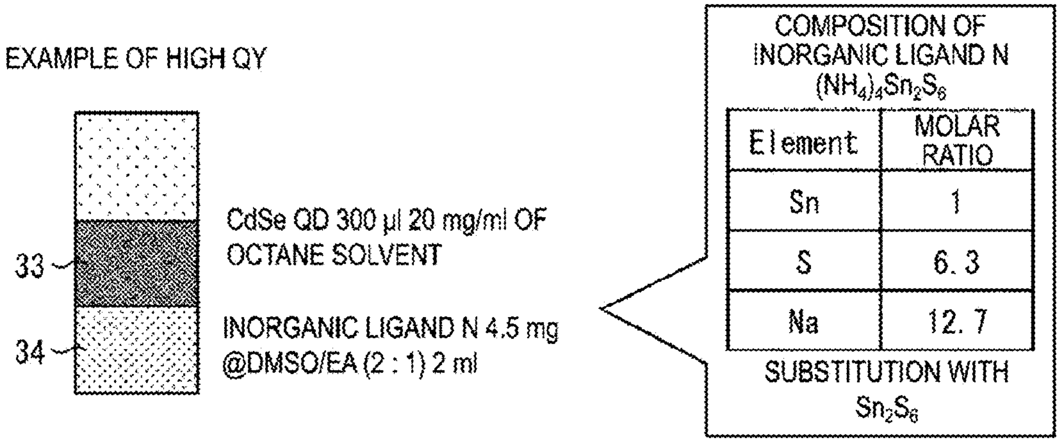
FIG. 6 is a schematic view for describing a method for manufacturing a quantum dot dispersion solution for forming the light-emitting layer.
Figure 7:
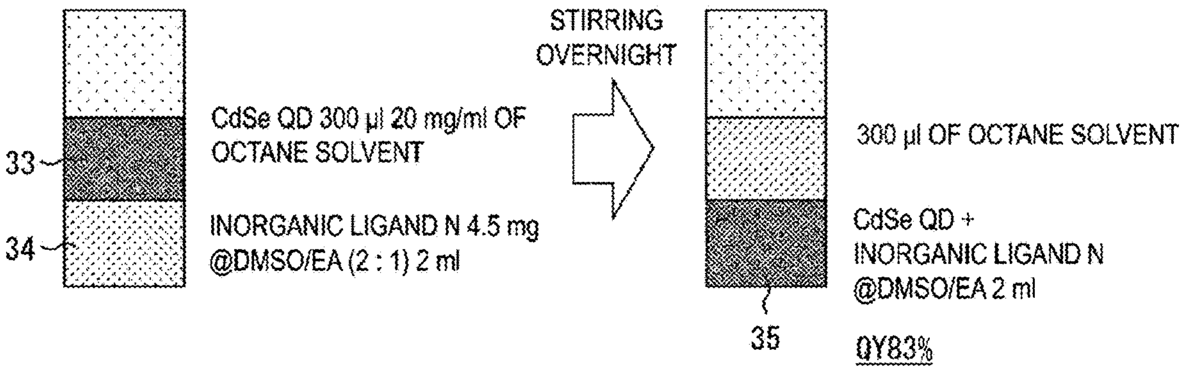
FIG. 7 is another schematic view for describing the method for manufacturing the quantum dot dispersion solution.

FIG. 6 is a schematic view for describing a method for manufacturing a quantum dot dispersion solution for forming the light-emitting layers 24REM, 24GEM, and 24BEM. FIG. 7 is another schematic view for describing the method for manufacturing the quantum dot dispersion solution.

The quantum dot dispersion solution is obtained from a third solution 35 obtained by adding and mixing a second solution 34 to a first solution 33. The first solution 33 includes a non-polar solvent, an organic ligand capable of dispersing the quantum dot in the non-polar solvent, and the quantum dot coordinated with the organic ligand. The second solution 34 includes a polar solvent, a second compound including a compound including Sn (IV) and a chalcogen, and a third compound not including Sn and including a chalcogen.

The second compound is disassociated into the first cation and the compound. The third compound is disassociated into the second cation and the chalcogenium ion.

The quantum dot dispersion solution includes a polar solvent, the compound described above, a first compound, the compound described above, a quantum dot, and a chalcogenium ion.

In the present embodiment, $S^{2-}$ is added in addition to $Sn_2S_6^{4-}$ when $Sn_2S_6^{4-}$, which is a kind of inorganic ligand capable of patterning, is substituted and coordinated to the quantum dot 31. Thus, the quantum yield of the light-emitting element is improved by about 83%.

The reason why the quantum yield of the light-emitting element is improved by adding $S^{2-}$ at the time of the ligand substitution of $Sn_2S_6^{4-}$ will be described.

Sn becomes divalent $Sn^{2+}$ when constituting the compound SnS. Then, the divalent $Sn^{2+}$ has an effect of causing extinction of the quantum dot 31. It is considered that when S is added, the amount of divalent $Sn^{2+}$ that causes the extinction of the quantum dot 31 decreases, which improves the quantum yield.

Chemical reaction formulas occurring in the quantum dot dispersion solution are assumed to be the following (Formula 1) and (Formula 2).

[Expression 2]

$$Sn_2S_6^{4-} \rightleftharpoons 2SnS + 4S^{2-} \qquad \text{(Formula 1)}$$

$$Na_2S \longrightarrow 2Na^{+} + S^{2-} \qquad \text{(Formula 2)}$$

At the time of the ligand substitution of $Sn_2S_6^{4-}$, $Sn_2S_6^{4-}$ undergoes an equilibrium reaction represented by (Formula 1). Here, when $Na_2S$ is added at the time of the ligand substitution of $Sn_2S_6^{4-}$, a chemical reaction represented by (Formula 2) proceeds and $S^{2-}$ becomes excessive as a whole. Thus, the equilibrium reaction of (Formula 1) is shifted to the left. Since Sn in $Sn_2S_6^{4}$ is tetravalent $Sn^{4+}$, the equilibrium reaction of (Formula 1) is shifted to the left, which increases tetravalent $Sn^{4+}$ and decreases divalent $Sn^{2+}$. As a result, the quantum yield of the light-emitting element is improved.

As described above, the present inventors have newly focused on a change in valence of Sn in order to improve the quantum yield of a light-emitting element.

For ligand substitution according to the present embodiment, the following process is performed. First, DiMethyl SulfOxide (DMSO) of 1.3 ml and EthanolAmine (EA) of 0.7 ml are mixed (hereinafter, a mixed solution of DMSO and EA may be denoted as DMSO/EA), and inorganic ligands ($(NH_4)_4Sn_2S_6$) of 4.5 mg are dissolved in the mixed solvent to prepare the second solution 34. The cation of the inorganic ligand is not limited to $NH_4$+, and a general cation can be adopted. In a composition of the inorganic ligand, S is 6.3 times as much as Sn. Then, in the second solution 34, $Na_2S$ is mixed in addition to $(NH_4)_4Sn_2S_6$. When estimated from the composition, $Na_2S$ is mixed 3.3 times or more (molar ratio) of $(NH_4)_4Sn_2S_6$.

Next, the first solution 33 including 300 μl of an octane solvent of CdSe quantum dots for red (quantum dots 31) (20 mg/ml) coordinated with general organic ligands is put into the same container as that of the second solution 34.

FIG. 6 is a schematic view immediately after this process is performed. The solvent has a two layer structure of a mixed solvent of DMSO/EA and an octane solvent, and the quantum dots 31 are dispersed in the layer of the octane solvent.

By stirring the mixed solvent (second solution 34) and the octane solvent (first solution 33) that have the two layer structure overnight, $Sn_2S_6^{4-}$ is coordinated to the quantum dot, and the third solution 35 in which the quantum dots are dispersed in the mixed solvent of DMSO/EA positioned as the lower layer is generated. The quantum yield of the quantum dot 31 coordinated with $Sn_2S_6^{4-}$ and formed by such a process is a QY of 83%. FIG. 4 is a schematic view of the quantum dot 31 prepared in this manner. The ligand $Sn_2S_6^{4-}$ of the tetravalent tin-chalcogen compound 41, $S^{2-}$ of the chalcogenium ion 43 generated by $Na_2S$ mixed in advance, and SnS of the divalent tin-chalcogen compound 42 generated by the equilibrium reaction are present in the vicinity of the quantum dot 31. Hereinafter, the terms $Sn_2S_6^{4-}$ and the like mean $Sn_2S_6^{4-}$, $S^{2-}$, and SnS.

Comparative Example

Figure 8:
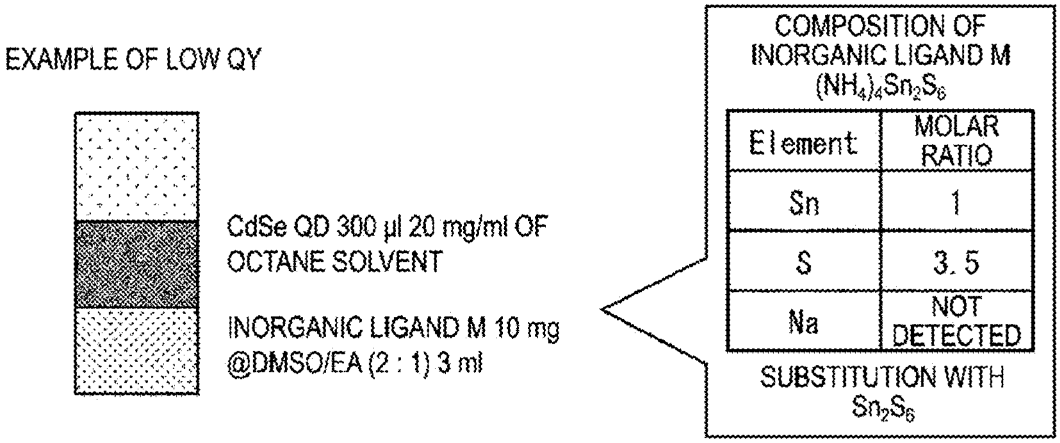
FIG. 8 is a schematic view for describing a method for manufacturing a quantum dot dispersion solution according to a comparative example.
Figure 9:
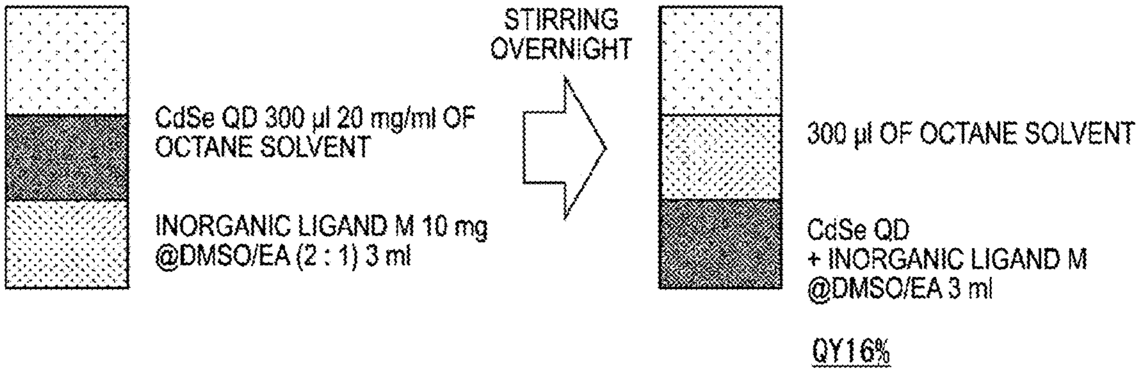
FIG. 9 is another schematic view for describing the method for manufacturing the quantum dot dispersion solution according to the comparative example.

FIG. 8 is a schematic view for describing a method for manufacturing a quantum dot dispersion solution according to a comparative example. FIG. 9 is another schematic view for describing the method for manufacturing the quantum dot dispersion solution according to the comparative example.

In the comparative example, a method of ligand substitution with only $Sn_2S_6^{4-}$ and a result thereof will be described. This ligand substitution carries out the following steps.

First, DMSO of 2 ml and EthanolAmine (EA) of 1 ml are mixed, and inorganic ligands $((NH_4)_4Sn_2S_6)$ of 10 mg are dissolved in the mixed solvent.

Then, 300 μl of an octane solvent of CdSe quantum dots for red (20 mg/ml) coordinated with general organic ligands is added to the same container.

FIG. 8 is a schematic view immediately after this step is performed. The solvent had a two layer structure of the mixed solvent of DMSO/EA and the octane solvent, and the quantum dots are dispersed in the layer of the octane solvent. A composition of Sn, S, and Na of ligand $((NH_4)_4Sn_2S_6)$ is illustrated in FIG. 8. Sn:S is approximately 1:3, and only $(NH_4)_4Sn_2S_6$ is dispersed in the DMSO/EA solvent.

By stirring this solvent overnight, $Sn_2S_6^{4-}$ is coordinated to the quantum dot, and the quantum dots are dispersed in the mixed solution of DMSO/EA positioned as the lower layer. A quantum yield of the quantum dot coordinated with $Sn_2S_6^{4-}$ prepared in this manner is as low as a QY of 16%, and it is difficult to apply the quantum dot to a QLED.

In the example described above with reference to FIG. 6 and FIG. 7, when $Sn_2S_6^{4-}$ of the tetravalent tin-chalcogen compound 41 is substituted and coordinated with the quantum dot 31, $S^{2-}$ of the chalcogenium ion 43 is added in addition to $Sn_2S_6^{4-}$, but in the comparative example described with reference to FIG. 8 and FIG. 9, $S^{2-}$ is not added. In the above-described example, the equilibrium reaction of (Formula 1) was shifted to the left by adding $S^{2-}$. However, in the present comparative example, the equilibrium reaction was not shifted to the left, and divalent $Sn^{2+}$ (Sn included in SnS of the divalent tin-chalcogen compound 42) causing the extinction of the quantum dot 31 was not decreased. As a result, it is considered that the quantum yield was not improved and became a very low value being a QY of 16%.

Second Embodiment

Hereinafter, a method for manufacturing the respective light-emitting elements 5R, 5G, and 5B will be described.

FIG. 10 to FIG. 14 are cross-sectional views for describing a manufacturing process of the respective light-emitting elements 5R, 5G, and 5B. Constituent elements similar to the constituent elements described above are denoted by the same reference numerals, and detailed descriptions thereof will not be repeated.

Patterning using the quantum dot dispersion solution (third solution 35) prepared as described above will be described with reference to FIG. 6 and FIG. 7. This patterning is carried out by the following steps.

Figure 10:
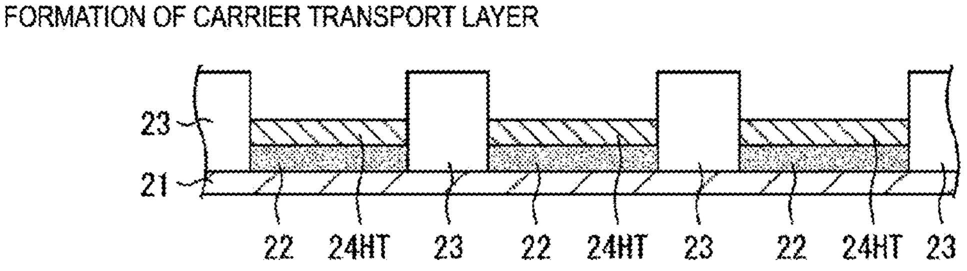
FIG. 10 is a cross-sectional view for illustrating a method for manufacturing each light-emitting element.
Figure 11:
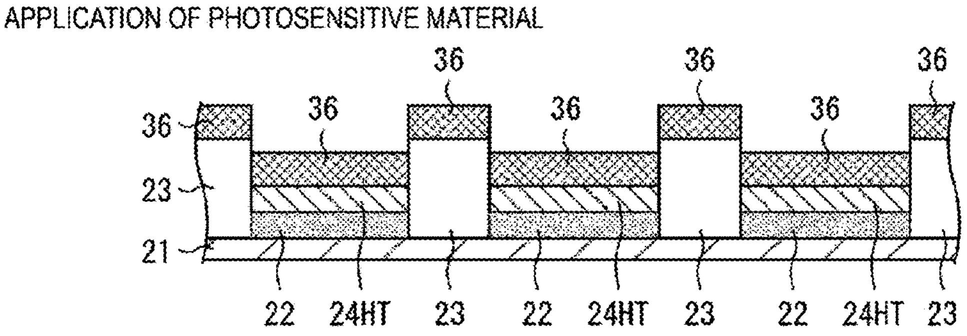
FIG. 11 is another cross-sectional view for describing the method for manufacturing each light-emitting element.

First, as illustrated in FIG. 10, the hole transport layer 24HT is formed on the anode 22. Then, as illustrated in FIG. 11, a photosensitive material 36 dissolved in a non-polar solvent is applied to the entire surfaces of the hole transport layer 24HT and the edge cover 23.

Figure 12:
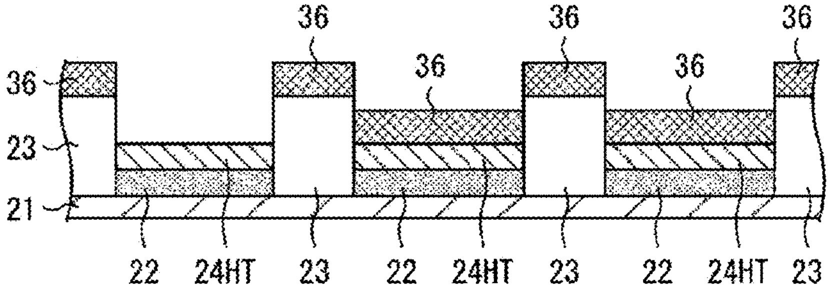
FIG. 12 is still another cross-sectional view for describing the method for manufacturing each light-emitting element.

Next, UltraViolet (UV) light is irradiated to a portion where the quantum dots are to remain (in this example, a portion corresponding to the red light-emitting element 5R), and as illustrated in FIG. 12, the photosensitive material 36 in the portion irradiated with the UV light is peeled off from the hole transport layer 24HT.

Figure 13:
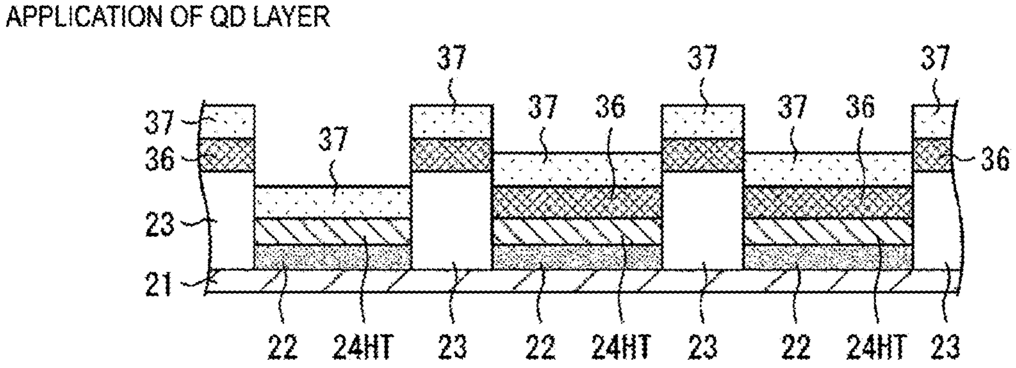
FIG. 13 is still another cross-sectional view for describing the method for manufacturing each light-emitting element.

Thereafter, as illustrated in FIG. 13, a quantum dot layer 37 based on a quantum dot dispersion solution is applied on the entire surfaces of the hole transport layer 24HT and the photosensitive material 36.

Figure 14:
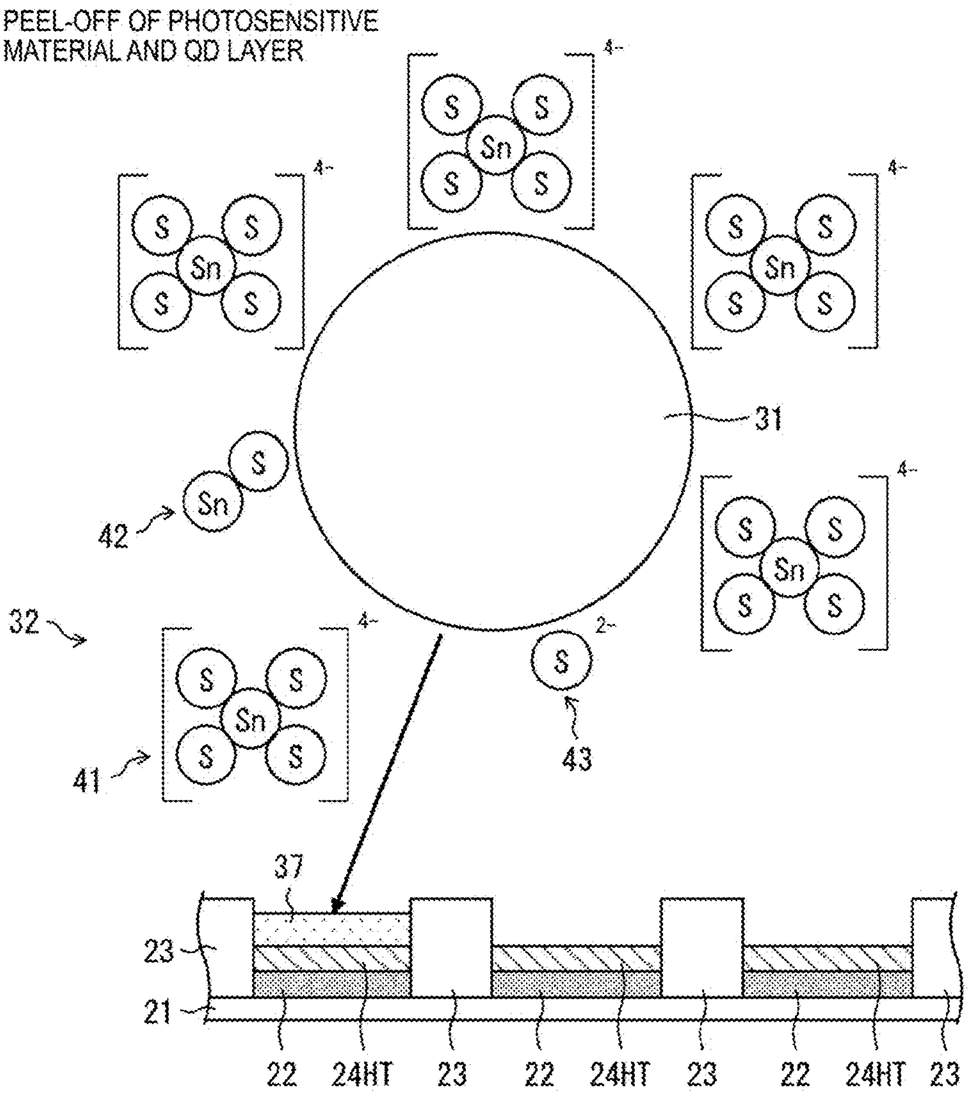
FIG. 14 is still another cross-sectional view for describing the method for manufacturing each light-emitting element.

Then, as illustrated in FIG. 14, the quantum dot layer 37 on the photosensitive material 36 is peeled off (lifted off) together with the photosensitive material 36 by using a non-polar solvent.

A ratio of Sn to S included in the quantum dot layer 37 prepared as described above holds the ratio of Sn to S in the quantum dot 31 prepared as illustrated in FIG. 6 and FIG. 7 at the time of solution dispersion.

FIG. 15 to FIG. 18 are cross-sectional views for describing another method for manufacturing the respective light-emitting elements 5R, 5G, and 5B. Constituent elements similar to the constituent elements described above are denoted by the same reference numerals, and detailed descriptions thereof will not be repeated.

The quantum dot dispersion solution (third solution 35) prepared as illustrated in FIG. 6 and FIG. 7 may be patterned in the steps illustrated in FIG. 15 to FIG. 18.

Figure 15:
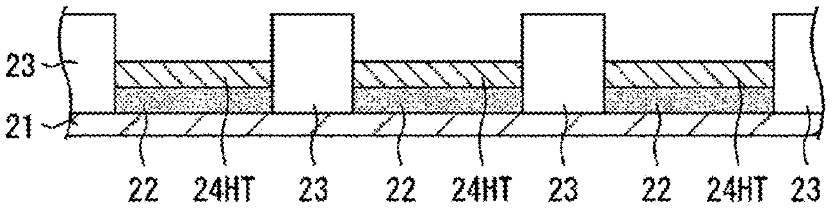
FIG. 15 is a cross-sectional view for describing another method for manufacturing each light-emitting element.
Figure 16:
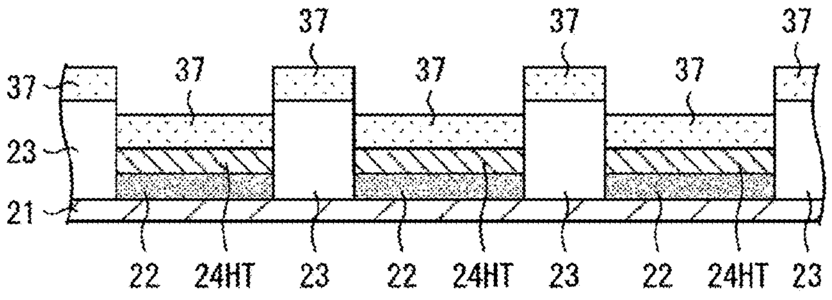
FIG. 16 is another cross-sectional view for describing the other method for manufacturing each light-emitting element.

First, as illustrated in FIG. 15, the hole transport layer 24HT is formed on the anode 22. Then, as illustrated in FIG. 16, the quantum dot layer 37 based on the quantum dot dispersion solution is applied to the entire surfaces of the hole transport layer 24HT and the edge cover 23 to be thinned. The quantum dot dispersion solution includes, for example, CdSe QDs for red and a solution in which inorganic ligands N are dissolved in 2 ml of a mixed solvent of DMSO/EA (2 ml of inorganic ligands N@DMSO/EA). For the thinning of the quantum dot layer 37, a general method of thinning such as a spin coating method, an ink-jet method, or a bar coating method can be applied.

Figure 17:
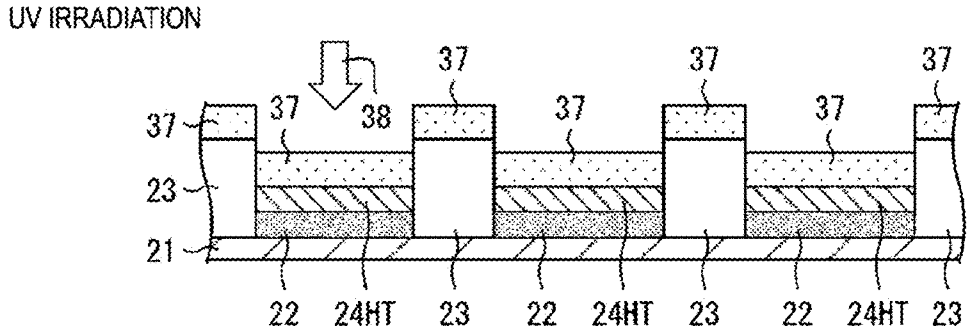
FIG. 17 is still another cross-sectional view for describing the other method for manufacturing each light-emitting element.

Next, a mask pattern (not illustrated) is produced and inserted between a light source and the quantum dot layer 37, and then, UV 38 is irradiated as illustrated in FIG. 17, resulting in forming the quantum dot layer 37 irradiated with the UV 38 and the quantum dot layer 37 not irradiated with the UV 38. $Sn_2S_6^{4-}$ of the quantum dot layer 37 irradiated with the UV 38 in this step is changed into $SnS_2$ by a chemical reaction represented by the following Formula 3.

[Expression 3]

$$Sn_2S_6^{4-} \rightarrow 2SnS_2 + 2S^{2-} \quad \text{(Formula 3)}$$

Figure 18:
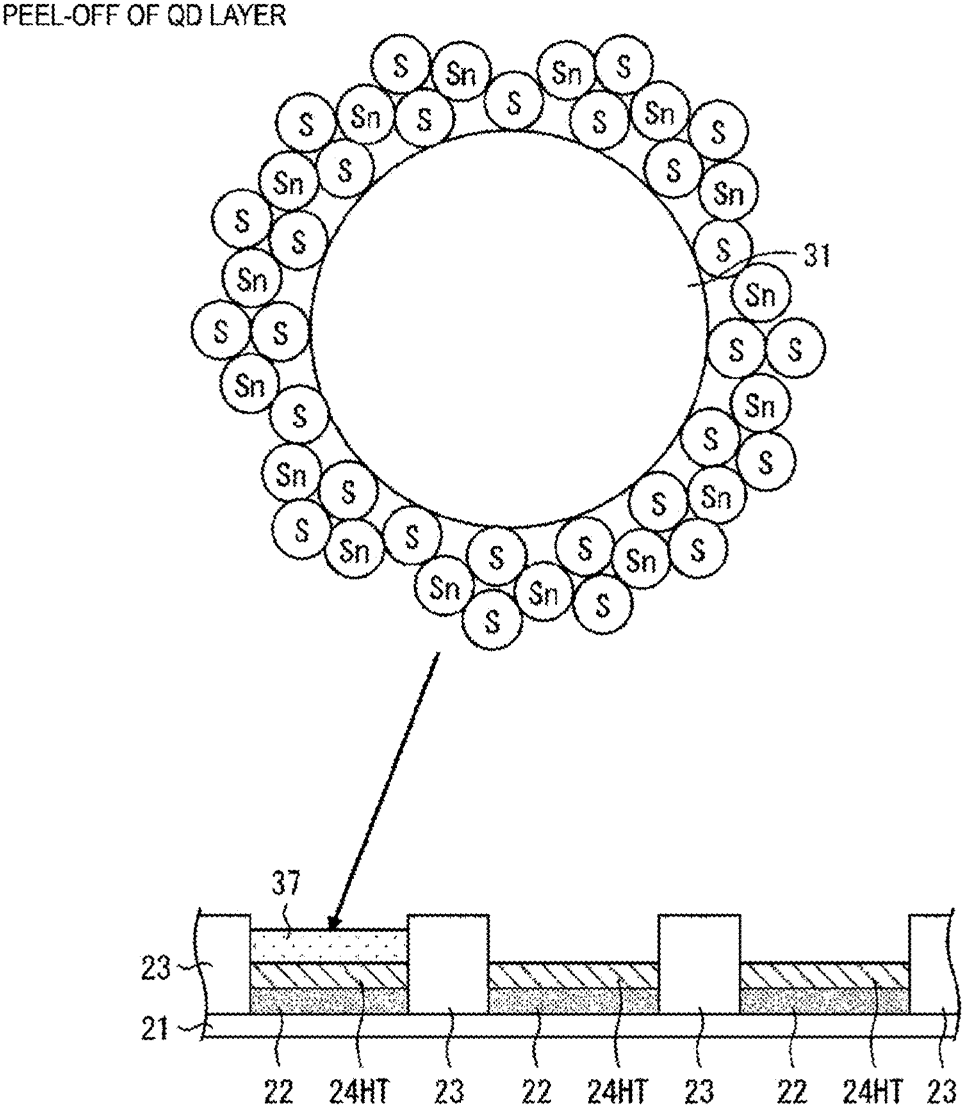
FIG. 18 is still another cross-sectional view for describing the other method for manufacturing each light-emitting element.

After that, the excessive quantum dot layer 37 after the processing is washed away by a polar solvent, and as illustrated in FIG. 18, the quantum dot layer 37 not irradiated with the UV 38 is dissolved and removed. The washing and removing may be carried out simultaneously or in separate steps.

The surface of the quantum dot 31 included in the quantum dot layer 37 formed as described above is protected only by $SnS_2$ in an ideal (unrealistic) system. In addition, the excessive $S^{2-}$ generated in the above Formula 3 is removed together with the polar solvent, and a composition ratio of the quantum dot layer 31 is ideally such that a ratio of S to Sn is 2:1.

Figure 20:
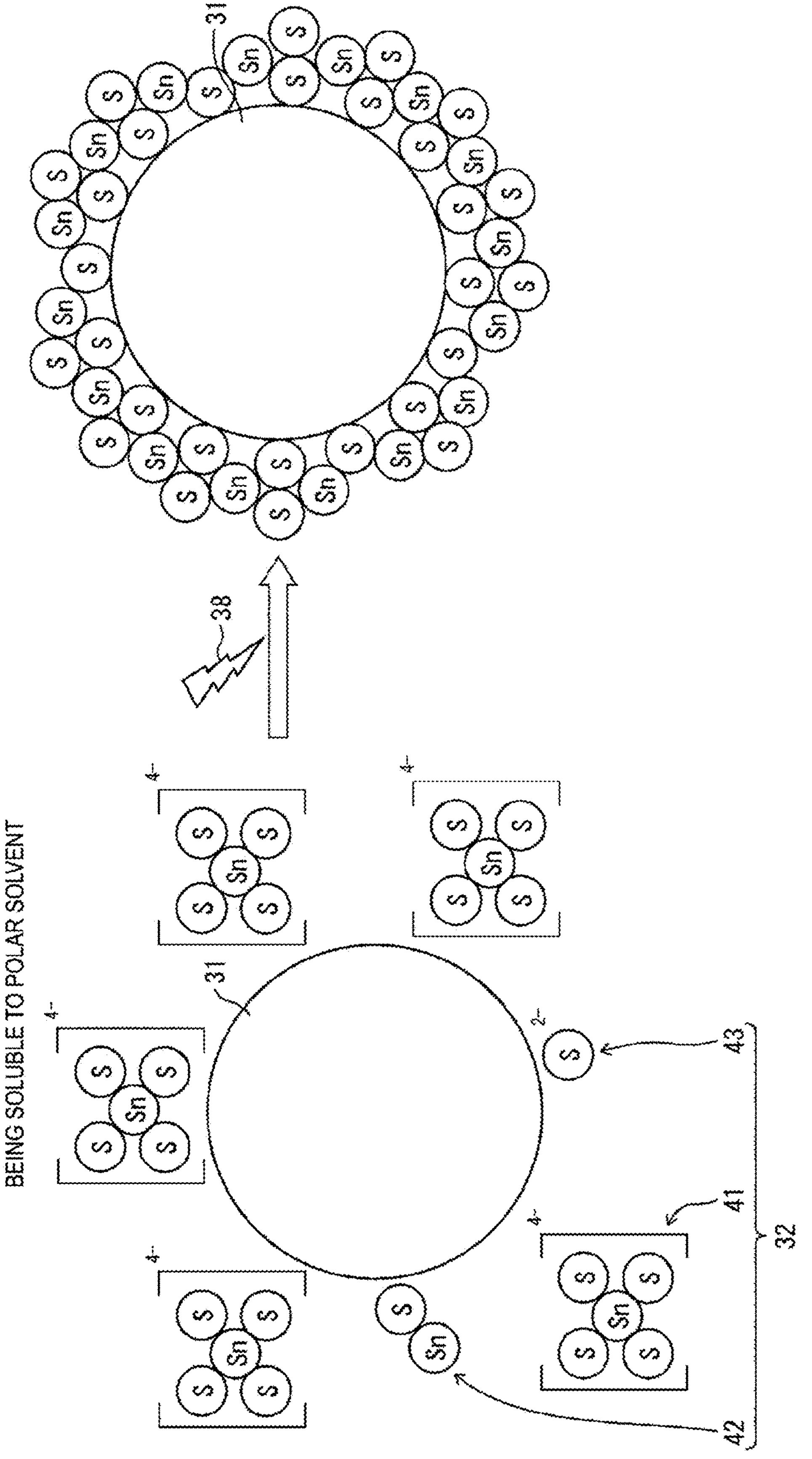
FIG. 20 is a schematic view for describing a patterning principle of the quantum dot layer.

However, in an actual example, the surface of the quantum dot 31 is not protected only by $SnS_2$ as in the above-described ideal case. That is, as illustrated in FIG. 18 and FIG. 20, the surface of the quantum dot 31 in the light-emitting layer after the UV irradiation is protected by $SnS_2$ (Sn (IV)) and also by SnS (Sn (II)).

For example, when the quantum dot layer is formed by using the quantum dot dispersion solution of the above-described comparative example (an example in which $S^{2-}$ is not added), SnS is present in a greater amount than that of the above-described example from the stage of the quantum dot dispersion solution due to an equilibrium reaction of the following Formula 1. Even if all of $Sn_2S_6^{4-}$ illustrated in Formula 3 is changed to $SnS_2$ by the step of irradiating of ultraviolet light, it is considered that SnS is still present in a great amount in the comparative example as compared with SnS in the example. Thus, it is assumed that SnS is present in a great amount in the comparative example as compared with the example even after patterning. Accordingly, it is considered that in the case of the quantum dot layer formed by using the quantum dot dispersion solution of the comparative example, divalent $Sn^{2+}$ (Sn of the compound SnS) that causes the extinction of the quantum dot is present in a greater amount than that in the case of adopting the example, which deteriorates the quantum yield.

[Expression 4]

$$Sn_2S_6^{4-} \rightleftharpoons 2SnS + 4S^{2-} \quad \text{(Formula 1)}$$

On the other hand, in the quantum dot layer formed by using the quantum dot dispersion solution described in the example, the amount of SnS is less than that in the comparative example from the stage of the quantum dot dispersion solution, and thus, the amount of SnS is less than that in the comparative example even after the formation of the quantum dot layer. That is, in the case of adopting the example, the amount of divalent $Sn^{2+}$ (Sn of the compound SnS) that causes the extinction of the quantum dot is less than that in the case of adopting the comparative example, and thus, the quantum yield is also improved.

In the example, a molar ratio of S relative to Sn is reduced compared to an ideal case. Specifically, the molar ratio of S is equal to or more than 1 and less than 2 relative to the molar ratio of Sn being 1.

As described above, as illustrated in FIG. 20, SnS (Sn (II)) and $SnS_2$ (Sn (IV)) are present in the quantum dot 31 of the light-emitting layer after UV irradiation using the quantum dot dispersion solution of the example, and a substance amount rate of SnS to $SnS_2$ is considered to be more than 0%. In addition, it is considered that patterning is difficult in a situation where SnS is excessively present (=a situation where $Sn_2S_6^{4-}$ is excessively less), and the upper limit thereof is assumed to be 50%.

As described above, the method for manufacturing the light-emitting element according to the present embodiment is the method for manufacturing each of the light-emitting elements 5R, 5G, and 5B according to the present embodiment, the method including (a) preparing the first solution 33 including a non-polar solvent, an organic ligand being nonionic, and the quantum dot coordinated with the organic ligand, (b) preparing the second solution 34 including a polar solvent, a second compound including the compound, and a third compound not including Sn, the third compound including a chalcogen, the third compound being ionic, the second compound being disassociated into a first cation and the compound, the third compound being disassociated into a second cation and the chalcogenium ion, (c) adding the second solution 34 to the first solution 33 and stirring, and then obtaining the third solution 35, (d) still-standing the third solution 35 and separating the third solution 35 into a first layer including the non-polar solvent and a second layer including the polar solvent, (e) removing the first layer from the third solution 35 and then obtaining a second layer as the quantum dot dispersion solution, and (f) applying the quantum dot dispersion solution onto the anode 22, volatilizing the polar solvent from the quantum dot dispersion solution, and then obtaining the quantum dot layer 37 (first light-emitting material layer).

The quantum dot 31 is protected by the organic ligand in the first solution 33. By the stirring, at an interface between the first solution 33 and the second solution 34, some or all of the organic ligands are separated from the quantum dots 31, and the first compounds are coordinated to the quantum dots 31 as inorganic ligands. As described above, the ligands protecting the quantum dots 31 are exchanged.

The stirring in step (c) is preferably performed for a period equal to or more than 12 hours and less than 24 hours. By stirring for the period equal to or more than 12 hours, the quantum dots 31 sufficiently moves from the first solution 33 to the second solution 34. In addition, by stirring for the period less than 24 hours, the quantum dots 31 can be prevented from returning from the second solution 34 to the first solution 33, and deactivation due to growth and aggregation of the quantum dots 31 can be prevented.

The stirring in step (c) is preferably carried out under a dark condition. The stirring under the dark condition can prevent the deactivation due to the growth and aggregation of the quantum dots.

The method for manufacturing the light-emitting element according to the present embodiment, further includes (g) irradiating the quantum dot layer 37 (first light-emitting material layer) with ultraviolet light and forming a pattern, the quantum dot 31 included in a portion of the quantum dot layer 37 (first light-emitting material layer) irradiated with the ultraviolet light being configured to become insoluble in the polar solvent, the quantum dot 31 included in a portion of the quantum dot layer 37 not irradiated with the ultraviolet light being configured to remain soluble in the polar solvent, and (h) developing the quantum dot layer 37 by using the polar solvent, and the (f), the (g), and the (h) are preferably performed in this order. The light-emitting material layer is patterned by photoreactivity of the inorganic ligands. Thus, unlike a lift-off method and an etching method, it is not necessary to form a sacrificing layer. Further, unlike a QD-PR method, it is not necessary to add a photoresist material to the light-emitting material layer. Thus, the number of manufacturing processes of the display device can be reduced and the current consumption efficiency can be improved.

The method for manufacturing the light-emitting element according to the present embodiment, further includes (i) forming and patterning a sacrificing layer being soluble in the non-polar solvent on the anode 22 (first electrode) and j) removing the sacrificing layer by using the non-polar solvent, and the (i), the (f), and the ( ) are preferably performed in this order. The light-emitting material layer is patterned by a lift-off method.

Figure 19:
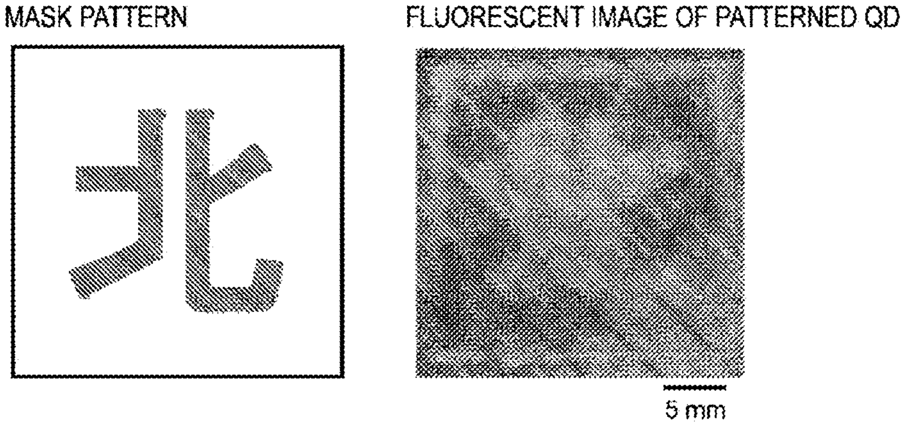
FIG. 19 is a schematic view for describing patterning of a quantum dot layer formed at the light-emitting layer.

FIG. 19 is a schematic view illustrating a fluorescent image of the quantum dots 31 patterned as illustrated in FIG. 15 to FIG. 18.

Specifically, the following steps were performed. First, the quantum dot layer 37 (CdSe QDs for red+inorganic ligands N@DMSO/EA of 2 ml) is formed into a thin film by a spin coating method. The quantum dot layer 37 is formed based on the quantum dot dispersion solution including CdSe QDs for red and a solution obtained by dissolving inorganic ligands N in 2 ml of the mixed solvent of DMSO/EA (inorganic ligands N@DMSO/EA of 2 ml). Then, by using Al as the material of a mask, the mask of a character meaning "north" is formed (by cutting out a portion of the character). The quantum dot layer 37 is irradiated with UV light of 365 nm through the mask.

Next, DMSO is dropped and spin-coated on the processed quantum dot layer 37 to form a pattern. In this step, the quantum dot layer 37 irradiated with UV remains, and the quantum dot layer 37 not irradiated with UV is peeled off.

Note that the principle of this patterning will be described as illustrated in FIG. 20. FIG. 20 is a schematic view for describing the principle of patterning the quantum dot layer 37.

The inorganic ligand 32 including $Sn_2S_6^{4-}$ of the tetravalent tin-chalcogen compound 41, SnS of the divalent tin-chalcogen compound 42, and $S^{2-}$ of the chalcogenium ion 43 is coordinated to the applied and untreated quantum dot 31. The quantum dot 31 is soluble in a polar solvent such as DMSO. When such a quantum dot 31 is irradiated with the UV 38, $Sn_2S_6^{4-}$ changes to $SnS_2$. Since $SnS_2$ is not dissolved in the polar solvent, the solubility/insolubility of the polar solvent can be controlled and patterning can be performed.

Modified Example

Figure 21:
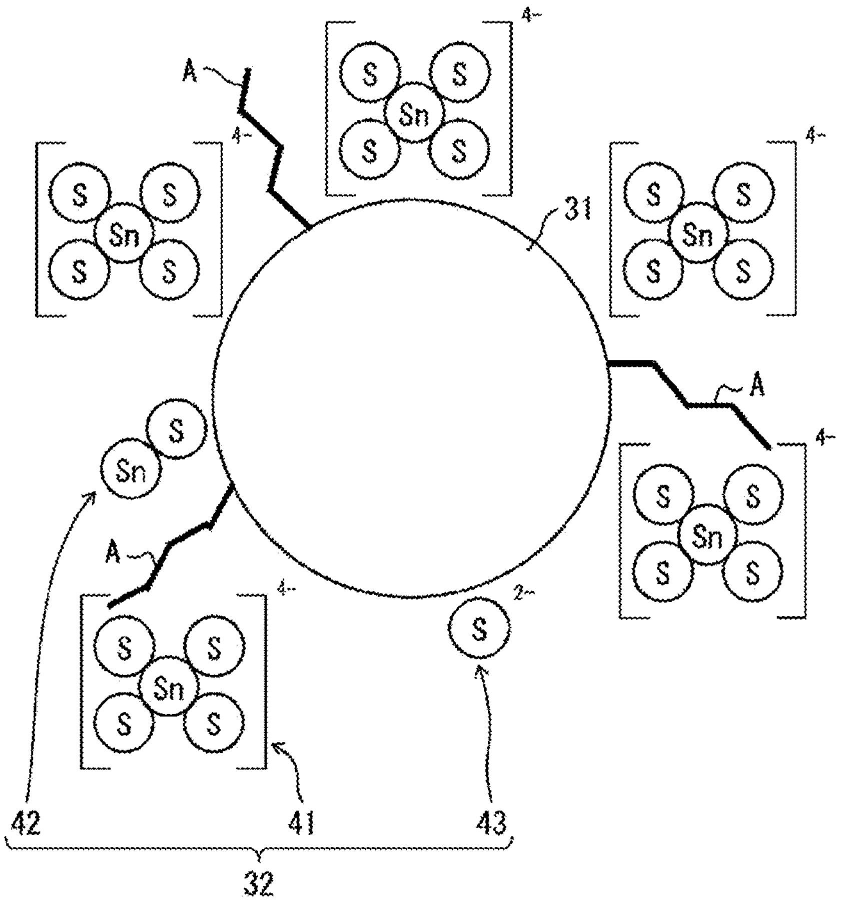
FIG. 21 is a schematic view illustrating a modified example of the quantum dot.
Figure 22:
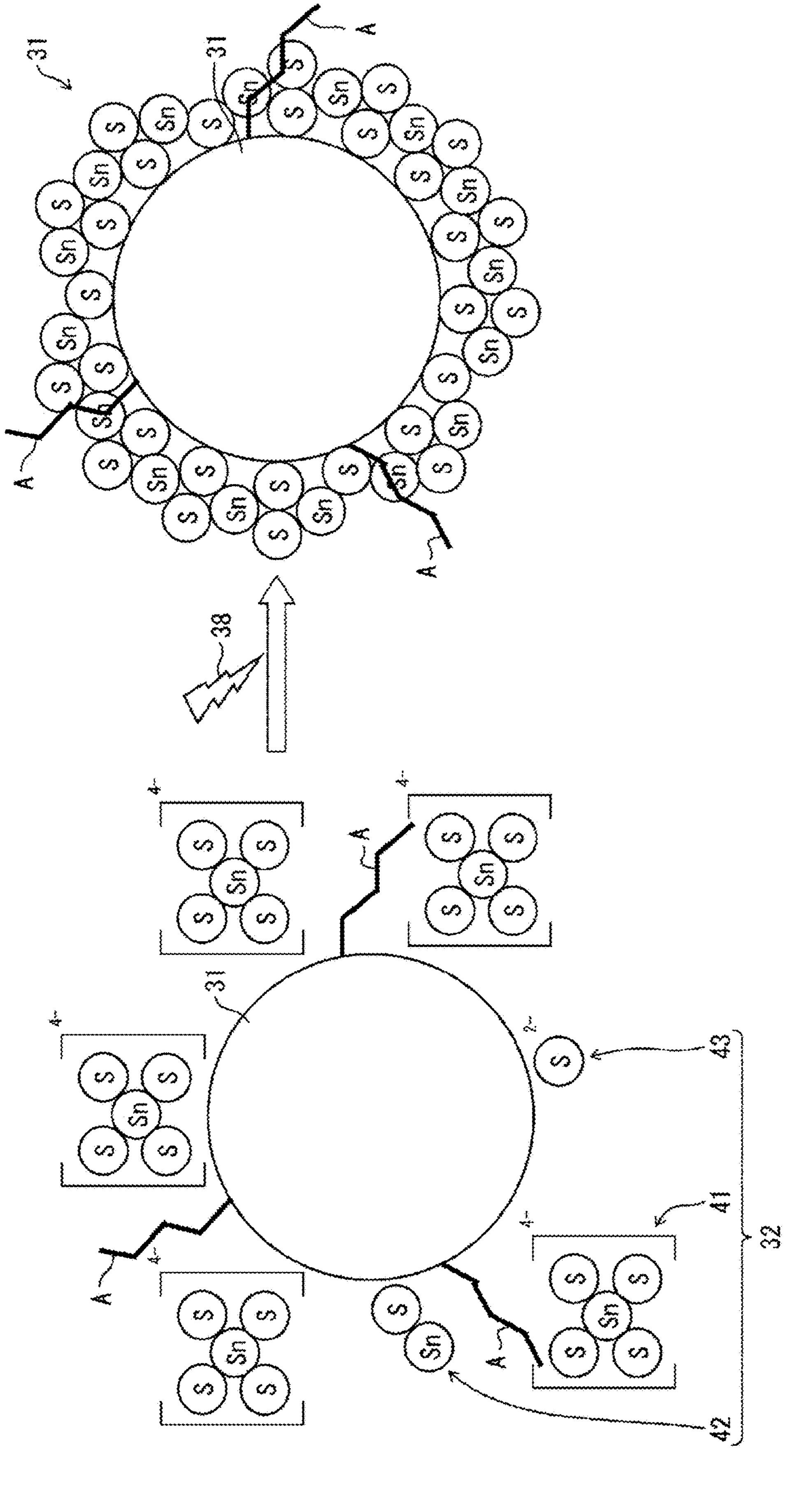
FIG. 22 is a schematic view for describing a patterning principle of the quantum dot according to the modified example.

FIG. 21 is a schematic view illustrating the quantum dot 31 according to a modified example. FIG. 22 is a schematic view for describing a principle of patterning the quantum dots 31 according to the modified example.

The entire surface of the quantum dot 31 according to the present embodiment is not necessarily coated with only the inorganic ligand 32 including $Sn_2S_6^{4-}$ of the tetravalent tin-chalcogen compound 41, SnS of the divalent tin-chalcogen compound 42, and $S^{2-}$ of the chalcogenium ion 43. For example, as illustrated in FIG. 21, another ligand A different from the inorganic ligand 32 including $Sn_2S_6^{4-}$ may be coordinated. The ligand A is not particularly limited, but it is more preferable that the following requirements be satisfied.

That is, it is more preferable that the ligand A does not have a function of dispersing in a polar solvent. This is because when the patterning step illustrated in FIG. 15 to FIG. 18 is performed, in a case where the ligand A has the function of dispersing in the polar solvent, the quantum dot layer 37 flows out by solvent application at the time of pattern formation and a pattern cannot be formed, but in a case where the ligand A does not have the function of dispersing in the polar solvent, the patterning step illustrated in FIG. 15 to FIG. 18 can be performed without problems. To be specific, a general organic ligand (TOP, OA, or the like) is more preferable as the ligand A, and this effect is not obtained in the case of an ionic ligand ($S^{2-}$, $F^-$, or the like). However, since the patterning step illustrated in FIG. 10 to FIG. 14 can be used, an ionic ligand ($S^{2-}$, $F^-$, or the like) may be used.

Further, it is not necessary that the ligand A and $Sn_2S_6^{4-}$ are alternately arranged as illustrated in FIG. 21. For example, $Sn_2S_6^{4}$ may be coordinated on the upper side of the surface of the quantum dot 31, and the ligand A may be coordinated on the lower side of the surface. In this case, in the step of removing the quantum dot layer 37 illustrated in FIG. 16 to FIG. 18, a contact with the solvent is facilitated, and an effect of facilitating the peel-off of the quantum dot layer 37 is achieved.

Furthermore, by adopting the ligand A having a long chain, the solvent can be controlled, for example, the dispersion solvent of the quantum dot 31 can have a small polarity.

Another method for manufacturing the light-emitting element according to the present embodiment is the method for manufacturing each of the light-emitting elements 5R, 5G, and 5B according to the present embodiment, the method including (a) preparing the first solution 33 including a non-polar solvent, an organic ligand being nonionic, and the quantum dot 31 coordinated with the organic ligand, (b) preparing the second solution 34 including a polar solvent, a second compound including the compound, and a third compound not including Sn, the third compound including a chalcogen, the third compound being ionic, the second compound being disassociated into a first cation and the compound, the third compound being disassociated into a second cation and the chalcogenium ion, (k) applying the first solution 33 onto the anode 22 (first electrode), volatilizing the non-polar solvent from the first solution 33, and then obtaining a second light-emitting material layer, and (l) applying the second solution 34 onto the second light-emitting material layer, and then obtaining a third light-emitting material layer.

The quantum dots are protected by the first organic ligands in the first solution 33. By applying the second solution 34, some of the organic ligands are separated from the quantum dots in the light-emitting material layer, and the second compounds are coordinated to the quantum dots 31 as inorganic ligands. As described above, the ligands protecting the quantum dots are exchanged.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A light-emitting element comprising:
a first electrode;
a second electrode facing the first electrode; and
a light-emitting layer disposed between the first electrode and the second electrode,
wherein the light-emitting layer includes
a compound including Sn (IV) and a chalcogen,
a quantum dot,
a first compound including Sn (II) and a chalcogen of the same element as the chalcogen, and
a chalcogenium ion of the same element as the chalcogen, and
a substance amount rate of the Sn (II) to the Sn (IV) is more than 0% and equal to or less than 50%.

2. A light-emitting element comprising:
a first electrode;
a second electrode facing the first electrode; and
a light-emitting layer disposed between the first electrode and the second electrode,
wherein the light-emitting layer includes a quantum dot including a core and a shell covering the core,
the shell includes a compound of Sn and a chalcogen, and
a composition ratio of the Sn to the chalcogen is 10:21 or a composition ratio where a composition of the chalcogen is greater than 21.

3. The light-emitting element according to claim 1,
wherein the chalcogen is S, Se, or Te.

4. The light-emitting element according to claim 1,
wherein a substance amount of the chalcogen included in the light-emitting layer is equal to or more than 410% of a total substance amount of the Sn (IV) and the Sn (II) included in the light-emitting layer.

5. The light-emitting element according to claim 4,
wherein the substance amount of the chalcogen included in the light-emitting layer is equal to or more than 630% of the total substance amount of the Sn (IV) and the Sn (II) included in the light-emitting layer.

6. The light-emitting element according to claim 1,
wherein the light-emitting layer is formed of a quantum dot dispersion solution obtained from a third solution obtained by adding and mixing a second solution to a first solution,
the first solution includes a non-polar solvent, an organic ligand, and the quantum dot coordinated with the organic ligand,
the second solution includes a polar solvent, a second compound including the compound, and a third compound not including Sn, the third compound including a chalcogen,
the second compound is disassociated into a first cation and the compound,
the third compound is disassociated into a second cation and the chalcogenium ion, and
the quantum dot dispersion solution includes the polar solvent, the compound, the first compound, the compound and the quantum dot, and the chalcogenium ion.

7. A quantum dot dispersion solution comprising:
a compound including Sn (IV) and a chalcogen;
a quantum dot;
a first compound including Sn (II) and the chalcogen; and
a chalcogenium ion including the chalcogen,
wherein a substance amount of the Sn (II) included in the quantum dot dispersion solution is more than 0% and equal to or less than 50% of a substance amount of the Sn (IV) included in the quantum dot dispersion solution.

8. The quantum dot dispersion solution according to claim 7,
wherein the chalcogen is S or Se.

9. The quantum dot dispersion solution according to claim 7,
wherein the quantum dot dispersion solution is obtained from a third solution obtained by adding and mixing a second solution to a first solution,
the first solution includes a non-polar solvent, an organic ligand, and the quantum dot coordinated with the organic ligand,
the second solution includes a polar solvent, a second compound including the compound, and a third compound not including Sn, the third compound including a chalcogen,
the second compound is disassociated into a first cation and the compound,
the third compound is disassociated into a second cation and the chalcogenium ion, and
the quantum dot dispersion solution includes the polar solvent, the compound, the first compound, the quantum dot coordinated with the compound, and the chalcogenium ion.

10. A display device comprising:
the light-emitting element according to claim 1.

11. A method for manufacturing the light-emitting element according to claim 1, the method comprising:
(a) preparing a first solution including a non-polar solvent, an organic ligand being nonionic, and the quantum dot coordinated with the organic ligand;
(b) preparing a second solution including a polar solvent, a second compound including the compound, and a third compound not including Sn, the third compound including a chalcogen, the third compound being ionic, the second compound being disassociated into a first cation and the compound, the third compound being disassociated into a second cation and the chalcogenium ion;
(c) adding the second solution to the first solution and stirring, and then obtaining a third solution;
(d) still-standing the third solution and separating the third solution into a first layer including the non-polar solvent and a second layer including the polar solvent;
(e) removing the first layer from the third solution, and then obtaining the second layer as a quantum dot dispersion solution; and
(f) applying the quantum dot dispersion solution onto the first electrode, volatilizing the polar solvent from the quantum dot dispersion solution, and then obtaining a first light-emitting material layer.

12. The method for manufacturing the light-emitting element according to claim 11,
wherein the stirring in the (c) is performed for a period equal to or more than 12 hours and less than 24 hours.

13. The method for manufacturing the light-emitting element according to claim 11,
wherein the stirring in the (c) is performed under a dark condition.

14. The method for manufacturing the light-emitting element according to claim 11, further comprising:
(g) irradiating the first light-emitting material layer with ultraviolet light and forming a pattern, the quantum dot included in a portion of the first light-emitting material layer irradiated with the ultraviolet light being configured to become insoluble in the polar solvent, the quantum dot included in a portion of the first light-emitting material layer not irradiated with the ultraviolet light being configured to remain soluble in the polar solvent; and (h) developing the first light-emitting material layer by using the polar solvent, wherein the (f), the (g), and the (h) are performed in this order.

15. The method for manufacturing the light-emitting element according to claim 11, further comprising:

(i) forming and patterning a sacrificing layer being soluble in the non-polar solvent on the first electrode; and (j) removing the sacrificing layer by using the non-polar solvent, wherein the (i), the (f), and the (j) are performed in this order.

16. A method for manufacturing the light-emitting element according to claim 1, the method comprising:

(a) preparing a first solution including a non-polar solvent, an organic ligand being nonionic, and the quantum dot coordinated with the organic ligand;

(b) preparing a second solution including a polar solvent, a second compound including the compound, and a third compound not including Sn, the third compound including a chalcogen, the third compound being ionic, the second compound being disassociated into a first cation and the compound, the third compound being disassociated into a second cation and the chalcogenium ion;

(k) applying the first solution on the first electrode, volatilizing the non-polar solvent from the first solution, and then obtaining a second light-emitting material layer; and (1) applying the second solution onto the second light-emitting material layer, and then obtaining a third light-emitting material layer.

17. The method for manufacturing the light-emitting element according to claim 16, the method further comprising:

(g') irradiating the third light-emitting material layer with ultraviolet light and forming a pattern, the quantum dot included in a portion of the third light-emitting material layer irradiated with the ultraviolet light being configured to become insoluble in the polar solvent, the quantum dot included in a portion of the third light-emitting material layer not irradiated with the ultraviolet light being configured to remain soluble in the polar solvent; and (h') developing the third light-emitting material layer by using the polar solvent, wherein the (l), the (g') and the (h') are performed in this order.

18. The method for manufacturing the light-emitting element according to claim 16, the method further comprising:

(i) forming and patterning a sacrificing layer being soluble in the non-polar solvent on the first electrode; and (j) removing the sacrificing layer by using the non-polar solvent, wherein the (i), the (1), and the (j) are performed in this order.

19. The method for manufacturing the light-emitting element according to claim 11, wherein the polar solvent includes ethanolamine.

20. A method for manufacturing the quantum dot dispersion solution according to claim 7, the method comprising:

(a) preparing a first solution including a non-polar solvent, an organic ligand being nonionic, and the quantum dot coordinated with the organic ligand;

(b) preparing a second solution including a polar solvent, a second compound including the compound, and a third compound not including Sn, the third compound including a chalcogen, the third compound being ionic, the second compound being disassociated into a first cation and the compound, the third compound being disassociated into a second cation and the chalcogenium ion;

(c) adding the second solution to the first solution and stirring, and then obtaining a third solution;

(d) still-standing the third solution and separating the third solution into a first layer including the non-polar solvent and a second layer including the polar solvent; and (e) removing the first layer from the third solution, and then obtaining the second layer as the quantum dot dispersion solution.

* * * * *